(12) United States Patent
Park et al.

(10) Patent No.: US 8,089,159 B1
(45) Date of Patent: Jan. 3, 2012

(54) SEMICONDUCTOR PACKAGE WITH INCREASED I/O DENSITY AND METHOD OF MAKING THE SAME

(75) Inventors: Doo Hyun Park, Gwangu-si (KR); Jae Yoon Kim, Gangdong-gu (KR); Yoon Ha Jung, Suwon-si (KR)

(73) Assignee: Amkor Technology, Inc., Chandler, AZ (US)

( * ) Notice: Subject to any disclaimer, the term of this patent is extended or adjusted under 35 U.S.C. 154(b) by 724 days.

(21) Appl. No.: 11/866,886

(22) Filed: Oct. 3, 2007

(51) Int. Cl.
*H01L 23/48* (2006.01)
*H01L 23/52* (2006.01)
*H01L 29/40* (2006.01)
*H01L 23/12* (2006.01)
*H01L 21/44* (2006.01)

(52) U.S. Cl. ............... 257/773; 257/E23.004; 438/612

(58) Field of Classification Search .......... 257/666–733, 257/735, 773, 786; 438/106–127, 611–617
See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |
| 4,417,266 | A | 11/1983 | Grabbe |
| 4,451,224 | A | 5/1984 | Harding |
| 4,530,152 | A | 7/1985 | Roche et al. |
| 4,541,003 | A | 9/1985 | Otsuka et al. |
| 4,646,710 | A | 3/1987 | Schmid et al. |

(Continued)

FOREIGN PATENT DOCUMENTS

DE  19734794 A1  8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Charles Garber
*Assistant Examiner* — Calvin Choi
(74) *Attorney, Agent, or Firm* — Stetina Brunda Garred & Brucker

(57) ABSTRACT

The present invention is related to a semiconductor package and method for fabricating the same wherein the semiconductor package includes a die pad having a semiconductor die mounted thereto, and two or more sets of leads or I/O pads which extend at least partially about the die pad in spaced relation thereto and to each other. The formation of the die pad and the leads of the leadframe are facilitated by the completion of multiple plating and chemical etching processes in a prescribed sequence. The present invention is further related to a semiconductor package and method for fabricating the same wherein the semiconductor package includes a semiconductor die electrically connected a plurality of leads or I/O pads via a flip chip type connection, each of the leads being formed by the completion of multiple plating and chemical etching processes in a prescribed sequence.

21 Claims, 20 Drawing Sheets

U.S. PATENT DOCUMENTS

| | | | |
|---|---|---|---|
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,018,003 A | 5/1991 | Yasunaga | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson et al. | |
| 5,118,298 A | 6/1992 | Murphy | |
| 5,122,860 A | 6/1992 | Kikuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,285,352 A | 2/1994 | Pastore et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,417,905 A | 5/1995 | LeMaire et al. | |
| 5,424,576 A | 6/1995 | Djennas et al. | |
| 5,428,248 A | 6/1995 | Cha | |
| 5,434,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,467,032 A | 11/1995 | Lee | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,265 A | 3/1997 | Kitano et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,637,922 A | 6/1997 | Fillion et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasarathi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,683,943 A | 11/1997 | Yamada | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A | 3/1998 | Yamashita | |
| 5,736,432 A | 4/1998 | Mackessy | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davies et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,854,512 A | 12/1998 | Manteghi | |
| 5,856,911 A | 1/1999 | Riley | |
| 5,859,471 A | 1/1999 | Kuraishi et al. | |
| 5,866,939 A | 2/1999 | Shin et al. | |
| 5,866,942 A | 2/1999 | Suzuki et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,397 A | 3/1999 | Ewer | |
| 5,973,935 A | 10/1999 | Schoenfeld et al. | |
| 5,977,630 A | 11/1999 | Woodworth et al. | |
| 6,143,981 A | 11/2000 | Glenn | |
| 6,166,430 A | 12/2000 | Yamaguchi | |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |
| 6,184,573 B1 | 2/2001 | Pu | |
| 6,194,777 B1 | 2/2001 | Abbott et al. | |
| 6,197,615 B1 | 3/2001 | Song et al. | |
| 6,198,171 B1 | 3/2001 | Huang et al. | |
| 6,201,186 B1 | 3/2001 | Daniels et al. | |
| 6,201,292 B1 * | 3/2001 | Yagi et al. | 257/666 |
| 6,204,554 B1 | 3/2001 | Ewer et al. | |
| 6,208,020 B1 | 3/2001 | Minamio et al. | |

| | | |
|---|---|---|
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,281,566 B1 | 8/2001 | Magni |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Vekateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijinders |
| 6,465,883 B2 | 10/2002 | Olofsson |
| 6,472,735 B2 | 10/2002 | Isaak |
| 6,475,646 B2 | 11/2002 | Park et al. |
| 6,476,469 B2 | 11/2002 | Hung et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,603,196 B2 | 8/2003 | Lee et al. |
| 6,624,005 B1 | 9/2003 | DiCaprio et al. |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Mathews et al. |
| 6,696,752 B2 | 2/2004 | Su et al. |
| 6,700,189 B2 | 3/2004 | Shibata |
| 6,713,375 B2 | 3/2004 | Shenoy |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,858,919 B2 | 2/2005 | Seo et al. |
| 6,867,492 B2 | 3/2005 | Auburger et al. |
| 6,878,571 B2 | 4/2005 | Isaak et al. |
| 6,897,552 B2 | 5/2005 | Nakao |
| 6,927,478 B2 | 8/2005 | Paek |
| 6,969,905 B2 * | 11/2005 | Paulus ............ 257/666 |
| 7,002,805 B2 | 2/2006 | Lee et al. |
| 7,005,327 B2 | 2/2006 | Kung et al. |
| 7,015,571 B2 | 3/2006 | Chang et al. |
| 7,053,469 B2 | 5/2006 | Koh et al. |
| 7,102,209 B1 | 9/2006 | Bayan et al. |
| 7,185,426 B1 | 3/2007 | Hiner et al. |
| 2001/0008305 A1 * | 7/2001 | McLellan et al. ............ 257/692 |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0111722 A1 * | 6/2003 | Nakao ............ 257/686 |
| 2003/0164554 A1 | 9/2003 | Fee et al. |
| 2003/0168719 A1 | 9/2003 | Cheng et al. |
| 2003/0198032 A1 | 10/2003 | Collander et al. |
| 2004/0027788 A1 | 2/2004 | Chiu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |
| 2004/0080025 A1 | 4/2004 | Kasahara et al. |
| 2004/0089926 A1 | 5/2004 | Hsu et al. |
| 2004/0164387 A1 | 8/2004 | Ikenaga et al. |
| 2004/0253803 A1 | 12/2004 | Tomono et al. |
| 2006/0087020 A1 | 4/2006 | Hirano et al. |
| 2006/0157843 A1 | 7/2006 | Hwang |
| 2006/0231939 A1 | 10/2006 | Kawabata et al. |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |

| | | |
|---|---|---|
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.
Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

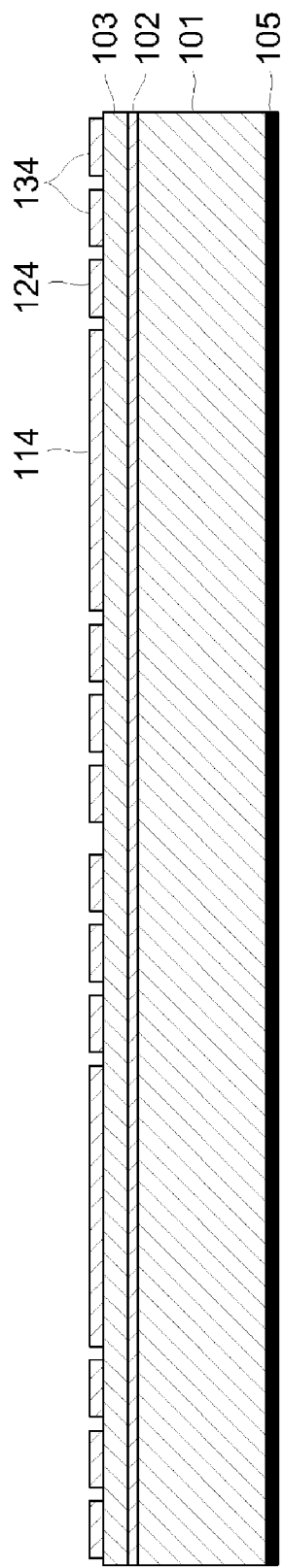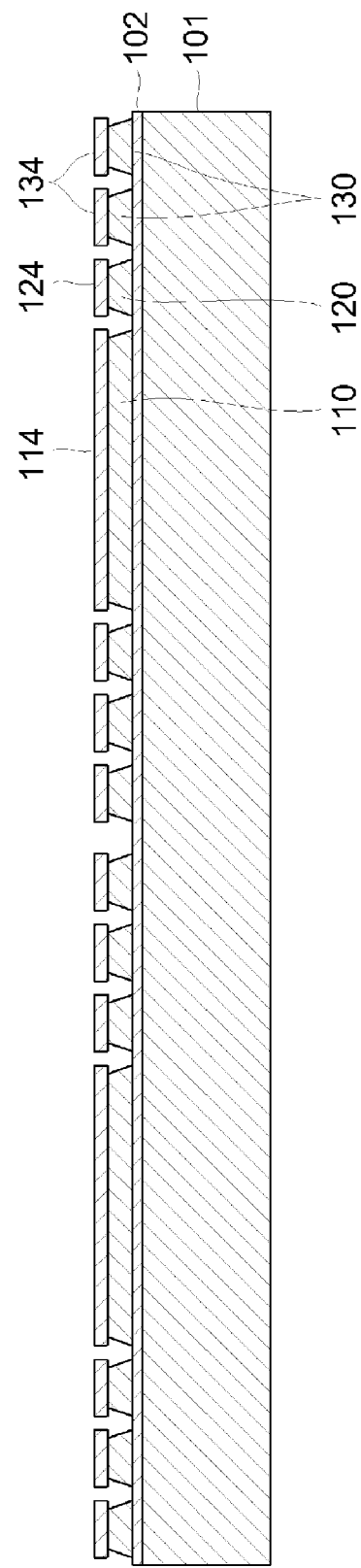

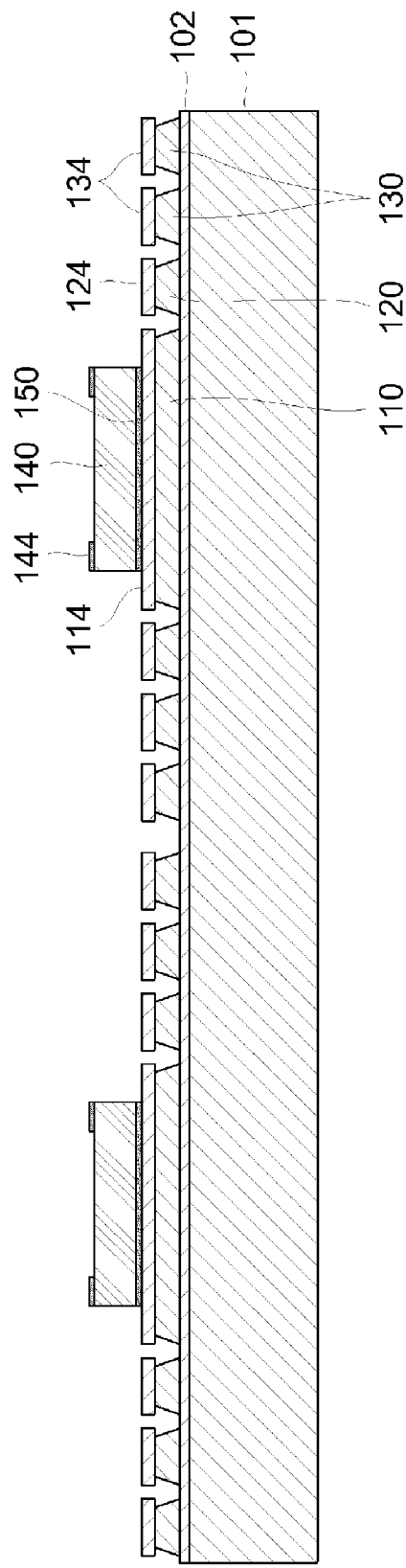
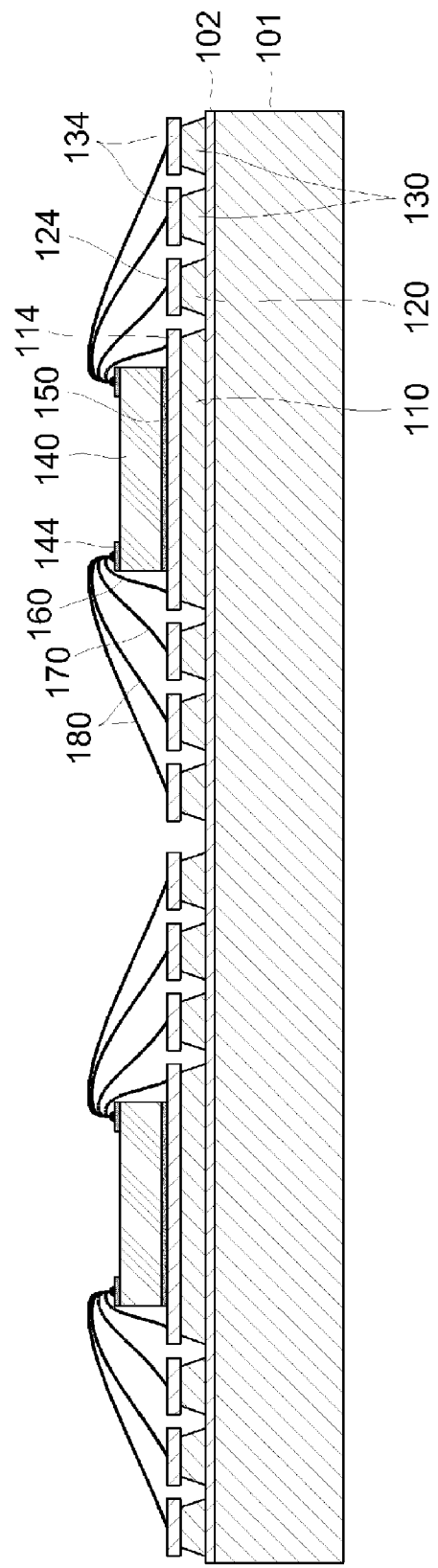

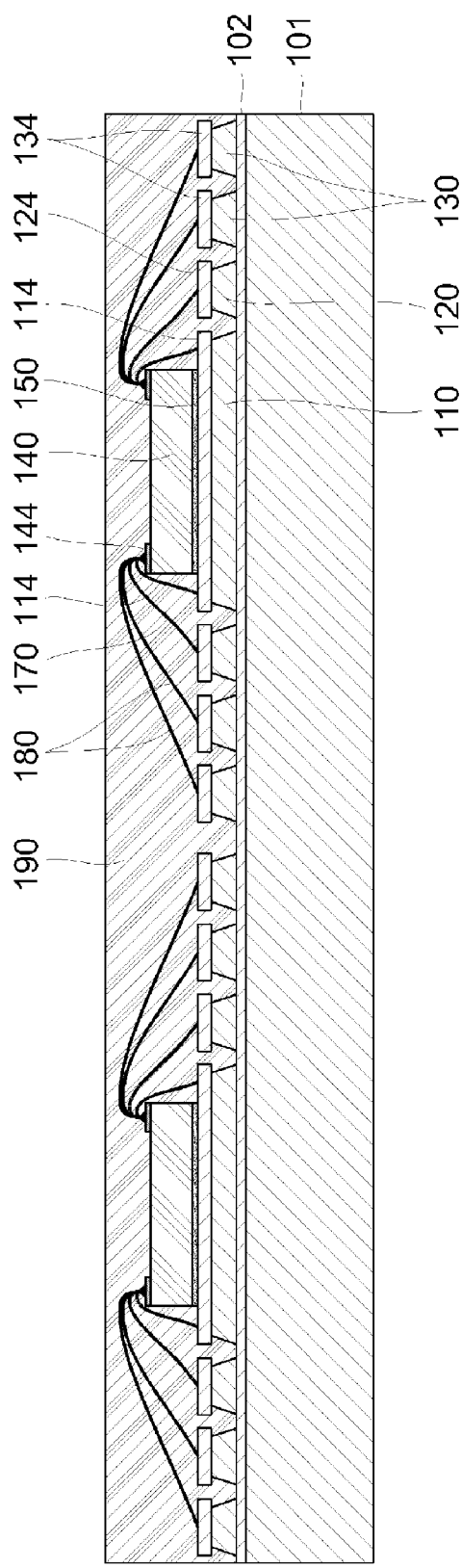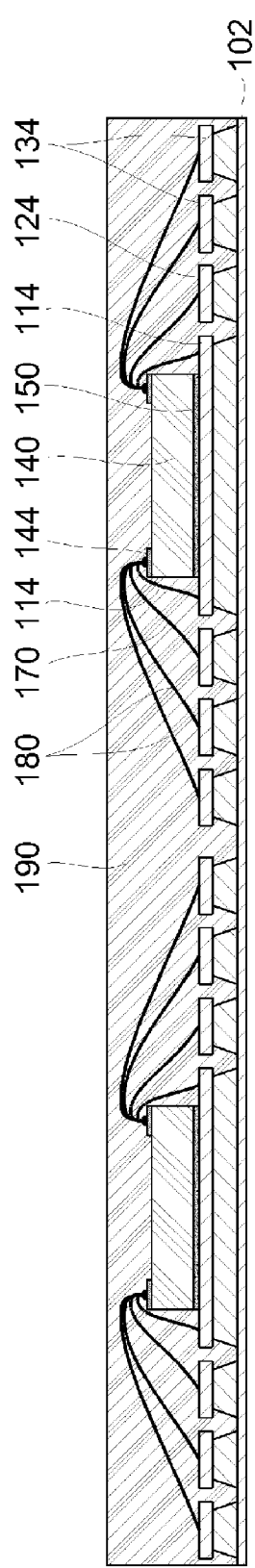

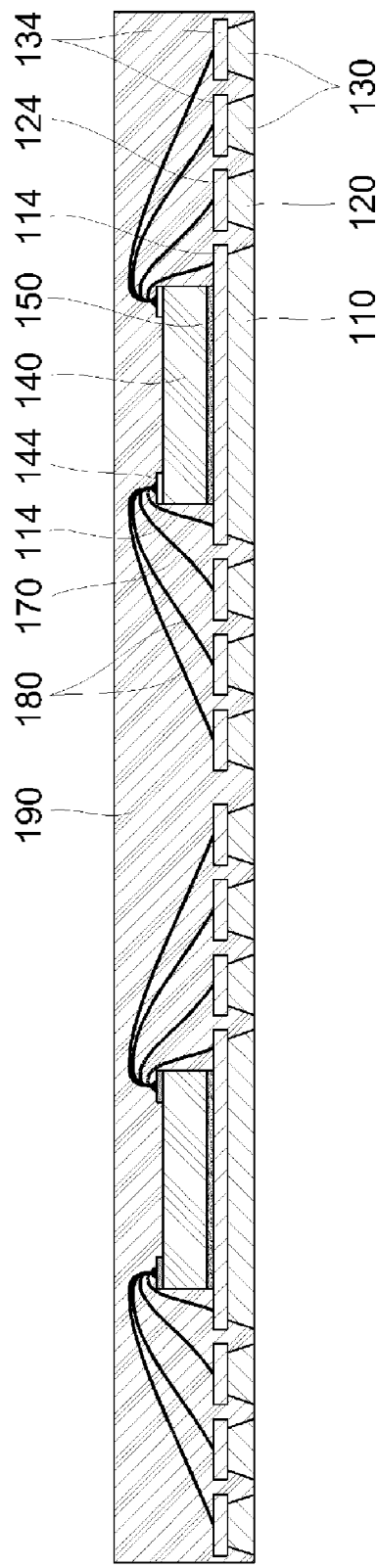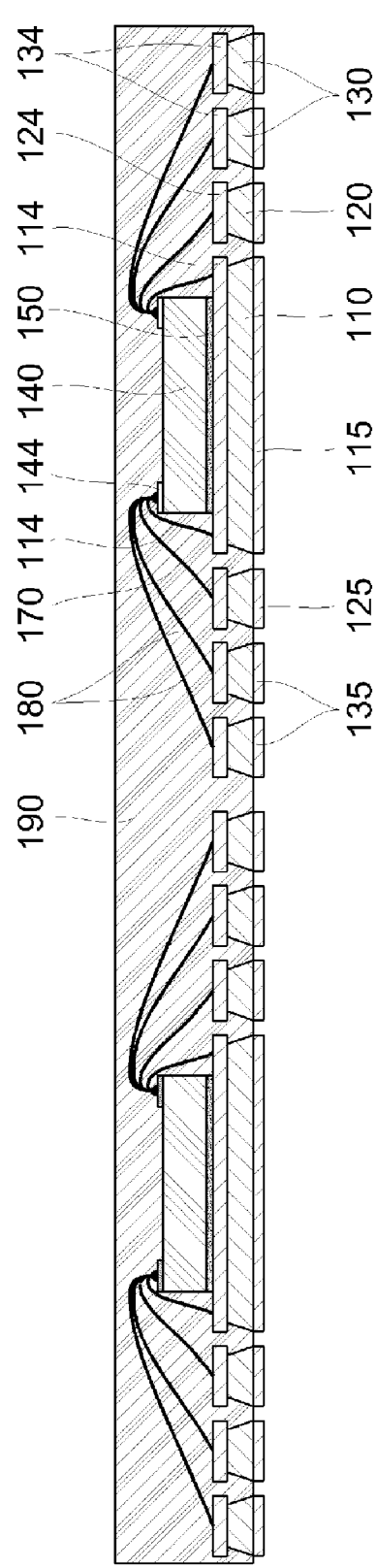

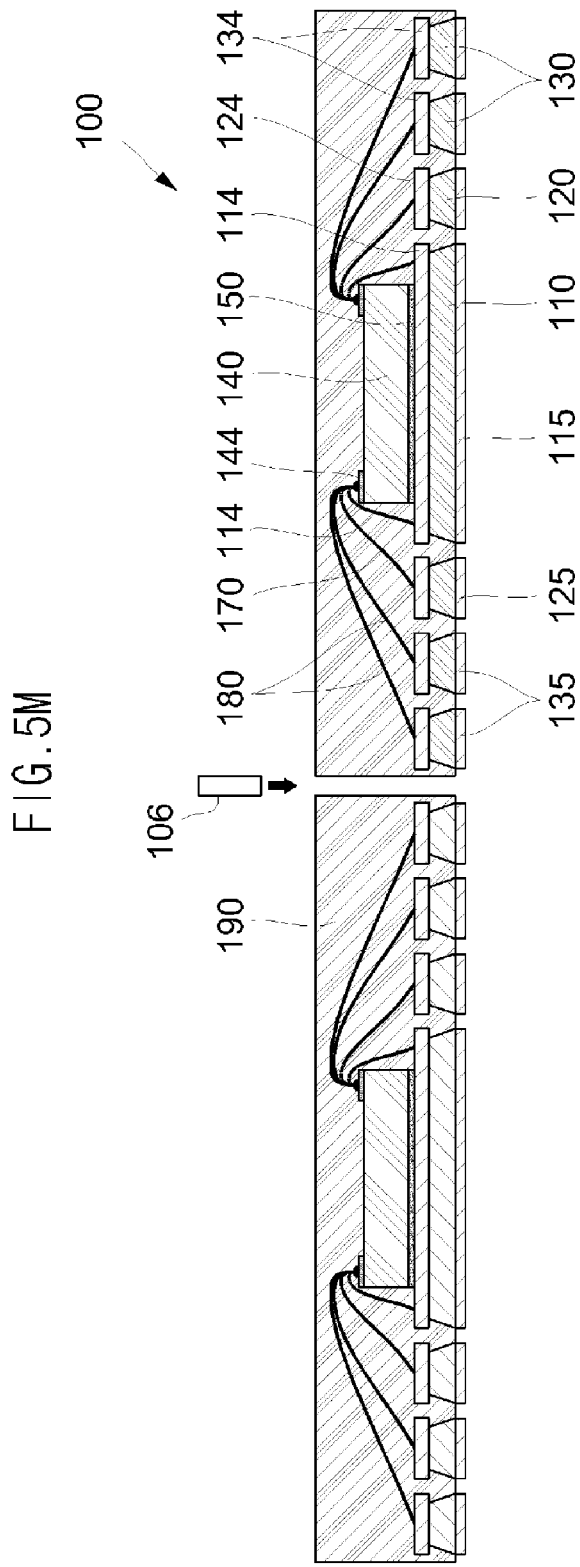

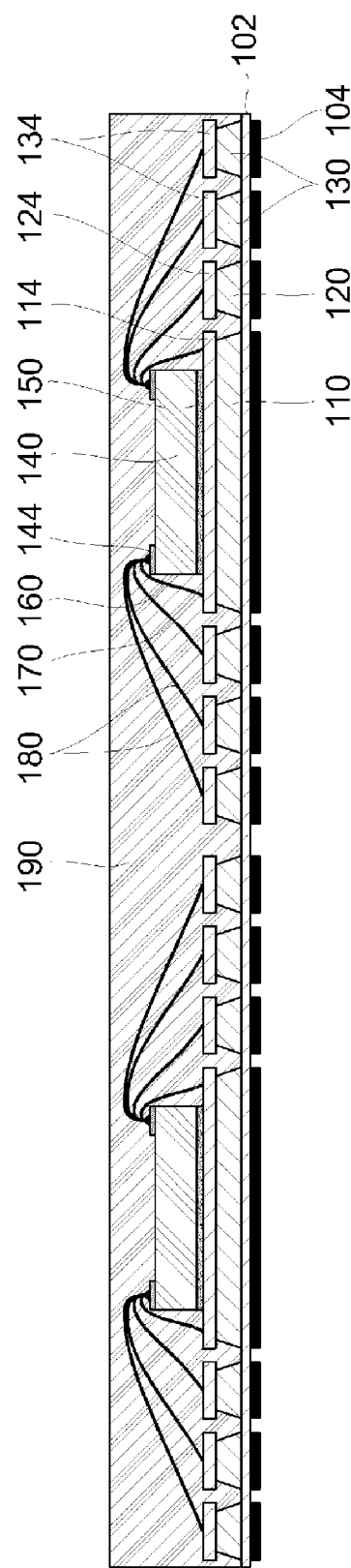
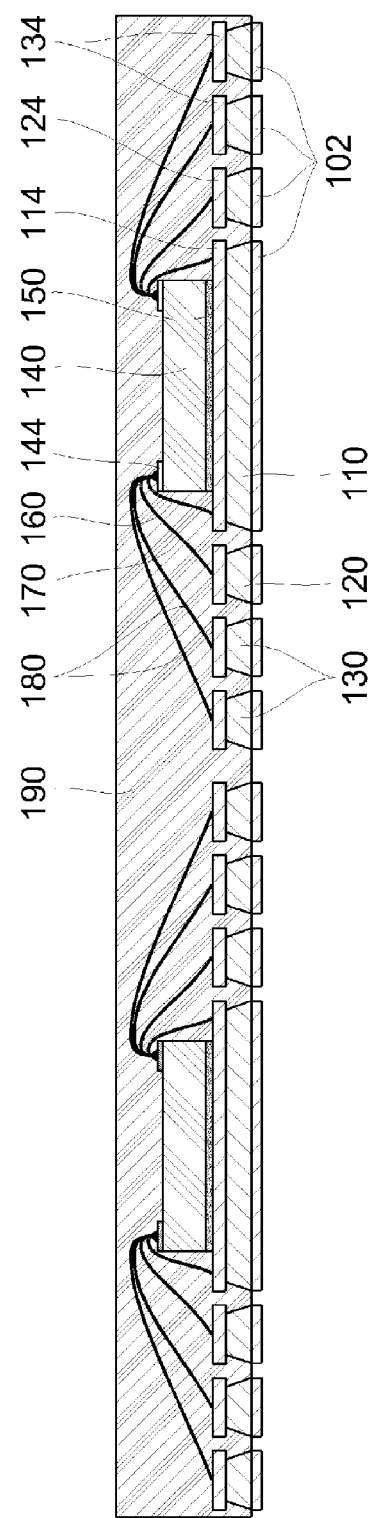
FIG. 6A
FIG. 6B

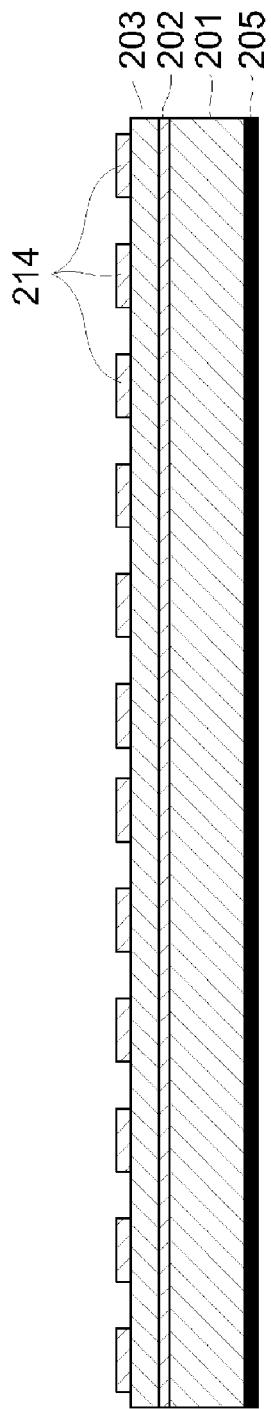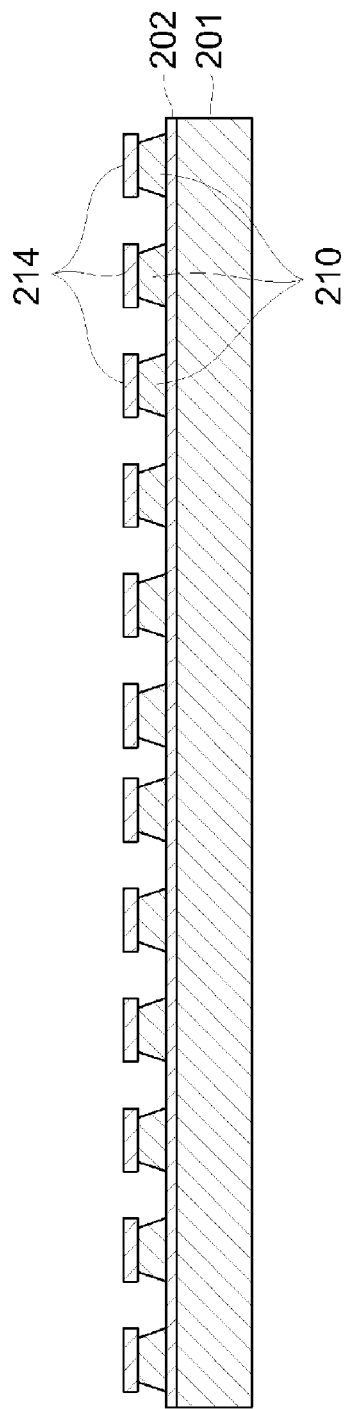

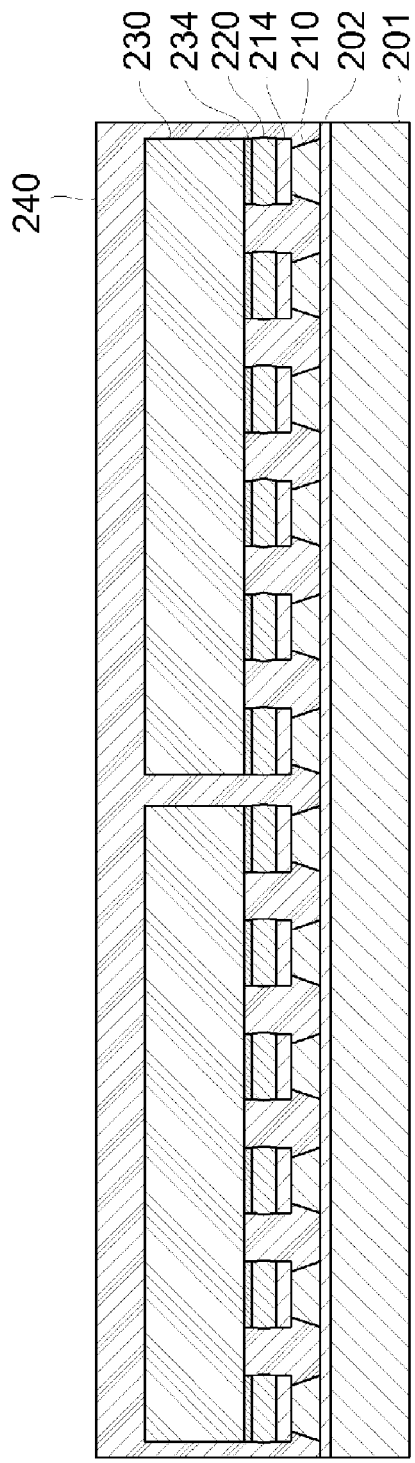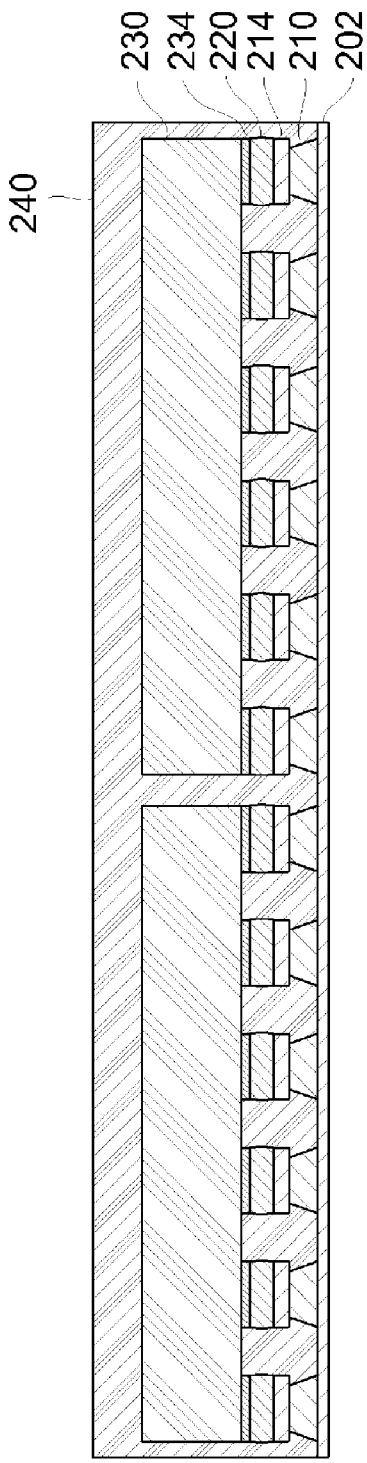

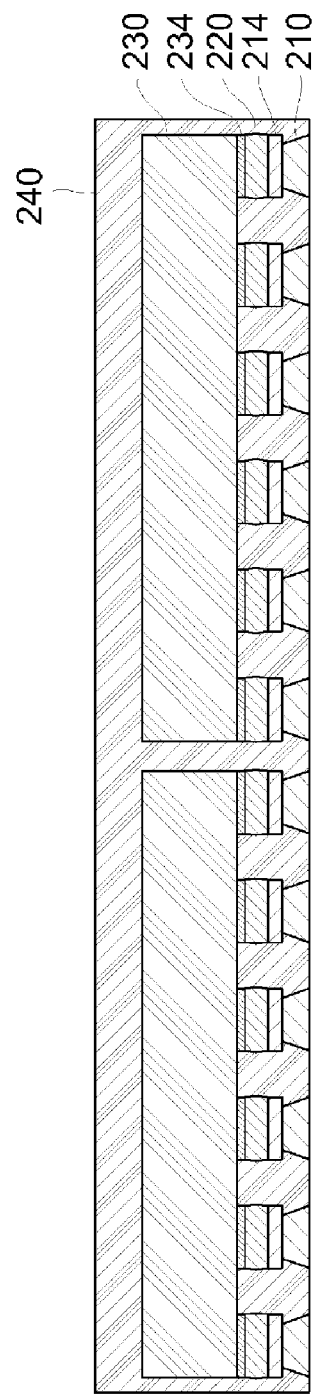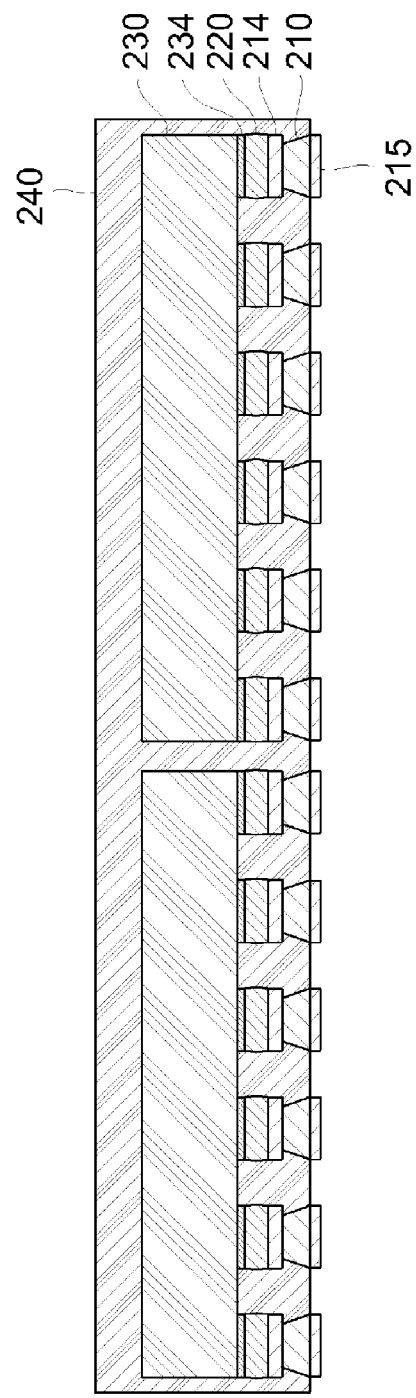

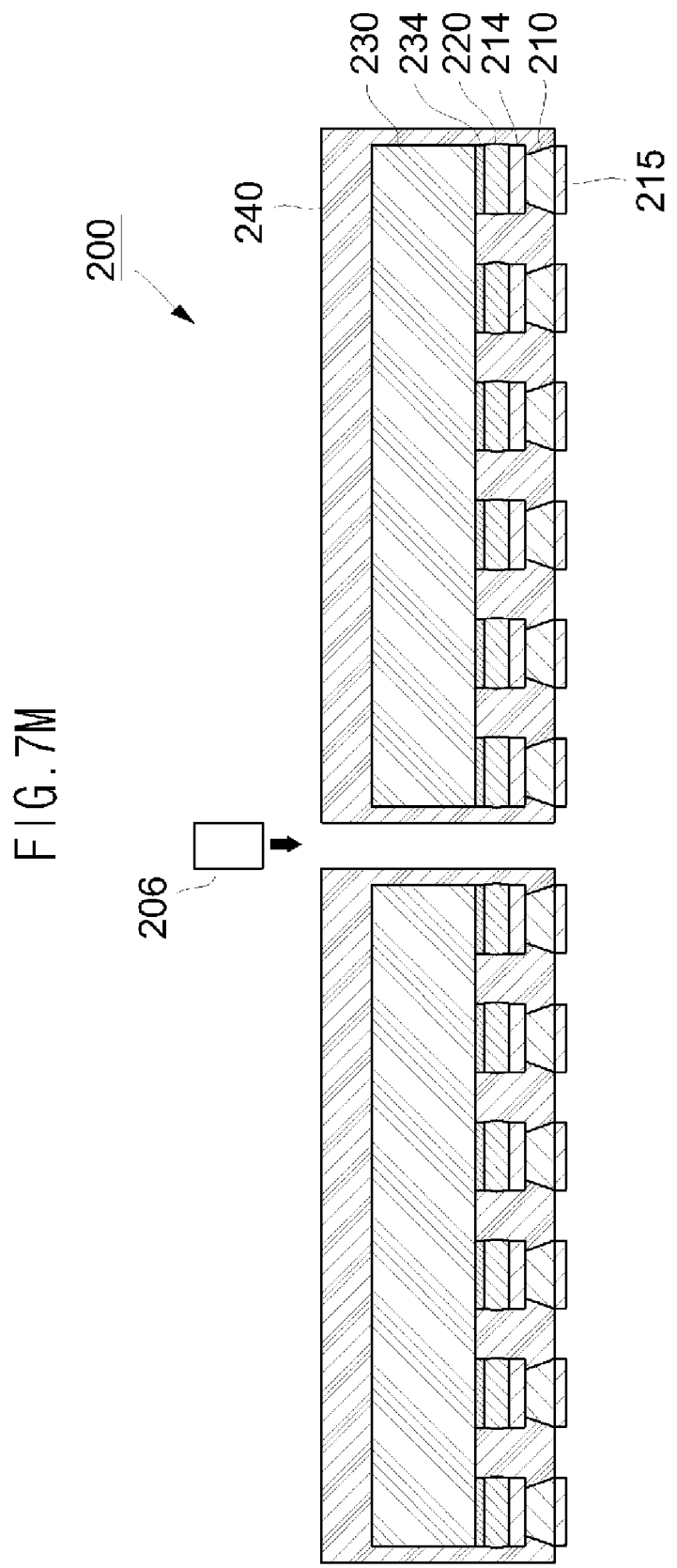

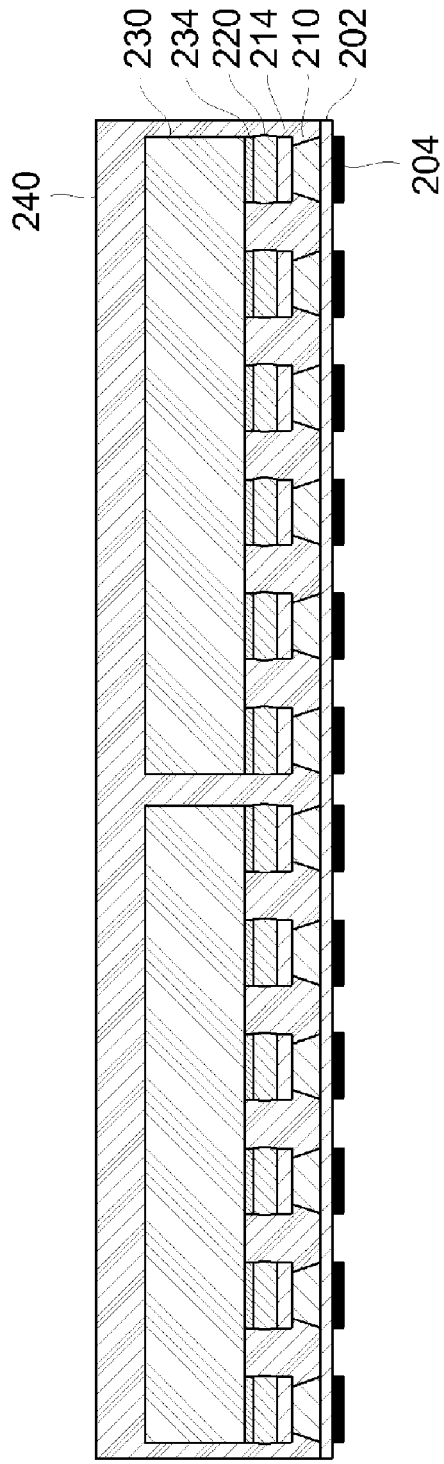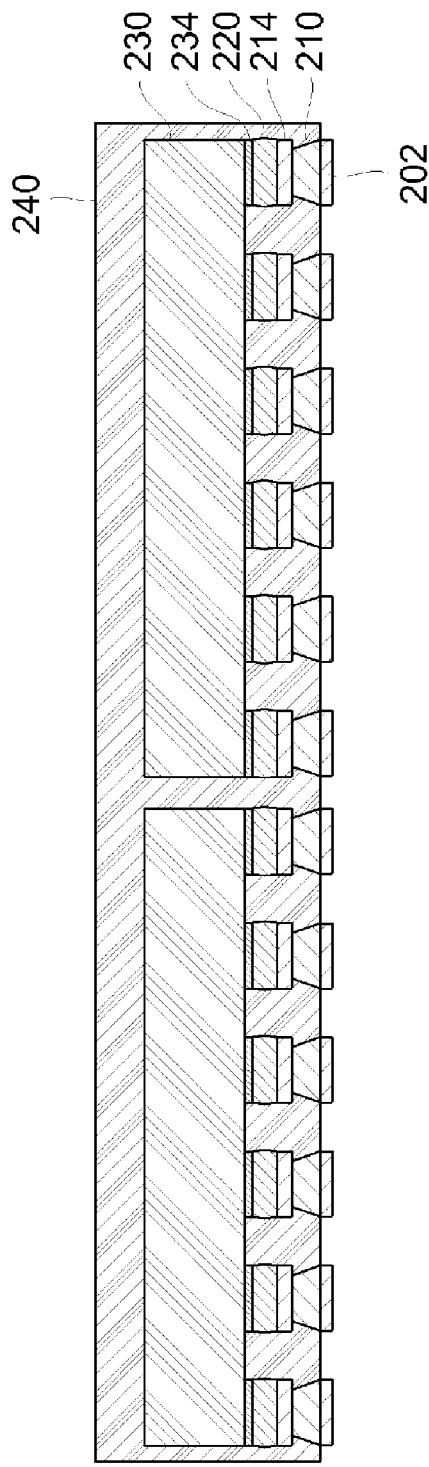

SEMICONDUCTOR PACKAGE WITH INCREASED I/O DENSITY AND METHOD OF MAKING THE SAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor packages, and more particularly to a semiconductor package having increased input/output (I/O) density and a method a fabricating the same.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads or I/O pads of the leadframe extend externally from the package body or are partially exposed therein for use in electrically connecting the package to another component, such as a printed circuit board or PCB. One portion of the leadframe which is internal to the package is commonly referred to as a die pad. The die pad is typically used as a support structure for one or more semiconductor dies which are also internal to the package. In many leadframe designs, the die pad is supported within the interior of an outer frame of the leadframe by multiple tie bars which extend between the outer frame and respective corners of the die pad. Tie bars are also often used to attach the individual leads of the leadframe to the outer frame thereof.

In the electronics industry, hand held portable applications such as cell phones, PDA's (Personal Digital Assistants), Bluetooth, and IMT2000 require semiconductor packages which are progressively smaller and lighter, yet of increasing performance. In many of the above-described conventional semiconductor packages wherein portions of the leads are partially exposed within the package body, such leads are typically included along only the peripheral edge of the package body. To meet the requirements of current hand held portable applications, the semiconductor packages used therein must have higher electrical performance and functionality, and thus increased numbers of leads or I/O pads which are electrically connectable to an external device. In addition to increased numbers of leads or I/O pads, it is also desirable for such semiconductor packages to be provided with a separate ground ring and/or power ring.

However, one of the drawbacks associated with conventional leadframe designs is that the tie bars needed to support the die pad, ground ring, or power ring within the outer frame of the leadframe occupy a substantial amount of space which could otherwise be used to accommodate additional leads or I/O pads of the leadframe. Additionally, the typical need to attach each of the leads or I/O pads to the outer frame of the leadframe via a separate tie bar also restricts the density at which such leads or I/O pads may be provided in the leadframe. Although it has been suggested in the prior art to narrow the pitch of the leads formed at the periphery of the bottom surface of the package body to increase the number of leads, there are physical limitations in narrowing the lead pitch during the manufacture of the leadframe. Also, excessive narrowing in the lead pitch gives rise to a susceptibility of solder shorting between the leads when the semiconductor package is connected to an external device through the use of solder.

Other currently known semiconductor package designs provide increased numbers of leads by arranging the leads on a common surface of the package body in multiple rows and columns. However, the manufacturing methodology associated with such semiconductor package designs typically involves the completion of a sawing process wherein a saw blade is advanced completely through portions of the leadframe and partially into portions of the package body of the semiconductor package. More particularly, the advancement of the saw blade through portions of the leadframe effectively electrically isolates such portions from each other in a manner facilitating the formation of the multiple columns and rows of leads. However, as a result of the sawing or singulation of the leadframe to facilitate the formation of the leads, the saw blade must necessarily cut into the surface of the package body in which the surfaces of the leads connectable to an underlying substrate are exposed. In these semiconductor packages, the sawing process gives rise to frequent occurrences of chip-out in the package body, as well as the formation of minute cracks in the leads. As a result, the completed semiconductor package may have a weakened mechanical structure. Moreover, the partial cutting of the package body as occurs during the sawing of the leadframe to facilitate the formation of the leads is somewhat unsightly due to the resultant grooves or scratches formed in the corresponding surface of the package body. Further difficulties arise as a result of the mechanical stresses applied to the package body during the sawing process. These and other difficulties are addressed by the semiconductor package manufacturing methodology of the present invention, as will be described in more detail below.

BRIEF SUMMARY OF THE INVENTION

In accordance with one embodiment of the present invention, there is provided a semiconductor package and method for fabricating the same wherein the semiconductor package includes a die pad having a semiconductor die mounted thereto, and two or more sets of leads or I/O pads which extend at least partially about the die pad in spaced relation thereto and to each other. The formation of the die pad and the leads of the leadframe are facilitated by the completion of multiple plating and chemical etching processes in a prescribed sequence. In accordance with another embodiment of the present invention, there is provided a semiconductor package and method for fabricating the same wherein the semiconductor package includes a semiconductor die electrically connected a plurality of leads or I/O pads via a flip chip type connection, each of the leads being formed by the completion of multiple plating and chemical etching processes in a prescribed sequence. The electrical isolation of the leads of the leadframe from each other and from the die pad (if included in the leadframe) through the implementation of an etching process eliminates the need for the completion of a sawing process as is often used in the fabrication of prior art semiconductor packages including leads arranged in multiple rows and columns.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIGS. 5A-5M illustrate an exemplary sequence of steps which may use to facilitate the fabrication of the semiconductor package of the first embodiment shown in FIGS. 1A and 1B;

FIGS. 6A-6B illustrate an number of exemplary steps which may be used as variant to certain steps shown in FIGS. 5A-5M to facilitate the fabrication of the semiconductor package of the first embodiment shown in FIGS. 1A and 1B;

FIGS. 7A-7M illustrate an exemplary sequence of steps which may use to facilitate the fabrication of the semiconductor package of the second embodiment shown in FIG. 4; and FIGS. 8A-8B illustrate an number of exemplary steps which may be used as variant to certain steps shown in FIGS. 7A-7M to facilitate the fabrication of the semiconductor package of the second embodiment shown in FIG. 4.

Common reference numerals are used throughout the drawings and detailed description to indicate like elements.

DETAILED DESCRIPTION OF THE INVENTION

Figure 1A:
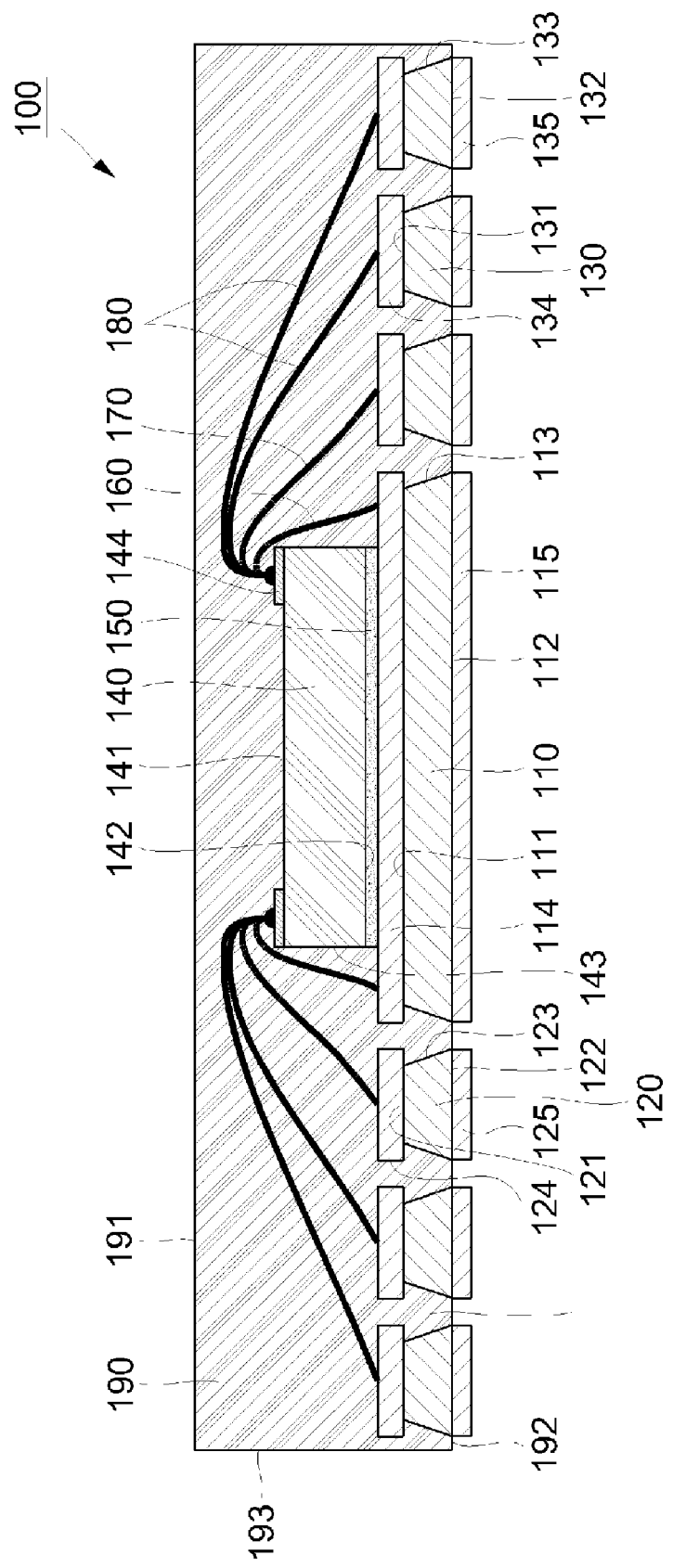
FIG. 1A is a cross-sectional view of a semiconductor package constructed in accordance with a first embodiment of the present invention.
Figure 1B:
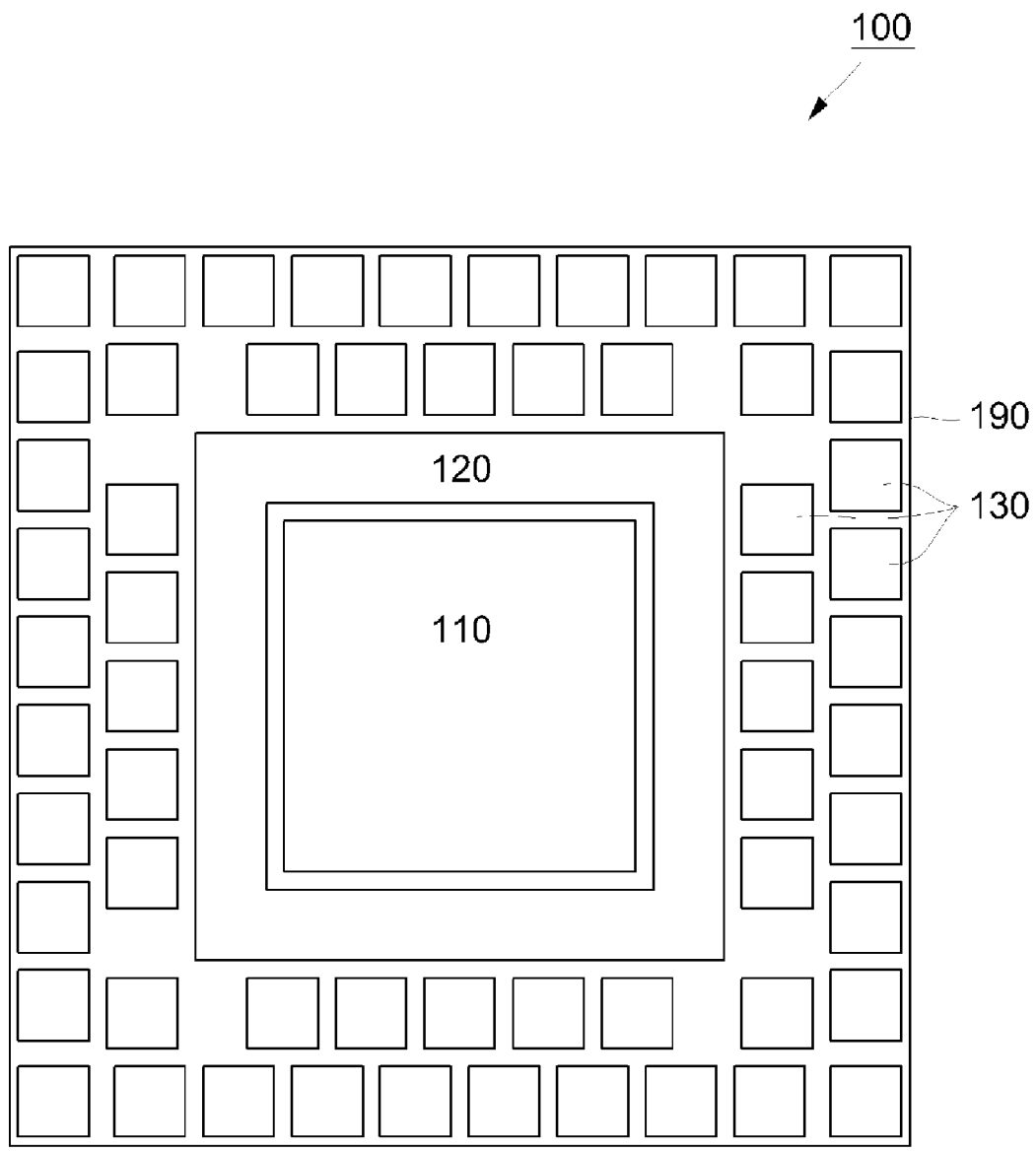
FIG. 1B is a bottom plan view of the semiconductor package of the first embodiment shown in FIG. 1A.

Referring now to the drawings wherein the showings are for purposes of illustrating preferred embodiments of the present invention only, and not for purposes of limiting the same, FIGS. 1A and 1B depict a semiconductor package 100 constructed in accordance with a first embodiment of the present invention. The semiconductor package 100 comprises a generally quadrangular die attach pad or die pad 110 which defines a generally planar first (top) surface 111 and an opposed, generally planar second (bottom) surface 112. Extending between the first and second surfaces 111, 112 is a third (side) surface 113. As best seen in FIG. 1A, the third surface 113 does not extend perpendicularly between the first and second surfaces 111, 112. Rather, the third surface 113 extends at an incline or angle between the first and second surfaces 111, 112. As a result, the area of the first surface 111 is smaller than that of the second surface 112. It is contemplated that the die pad 110 may be formed from any one of a number of suitable conductive metal materials, including copper or an equivalent material, though the present invention is not intended to be limited to any specific material for the die pad 110. As will be discussed in more detail below, since the die pad 110 is preferably formed of a conductive metal material, such die pad 110 may be used to transfer an electrical signal from a semiconductor die (e.g., a ground signal or a power signal) to the exterior of the semiconductor package 100, and may further be used to emit heat generated from the semiconductor die of the semiconductor package 100.

As is further seen in FIG. 1A, formed on the first surface 111 of the die pad 110 is a first plated layer 114 which is of a predetermined thickness. Importantly, the first plated layer 114 is sized so as to protrude beyond the circumference or periphery of the first surface 111 by a predetermined length or distance in a horizontal direction as viewed from the perspective shown in FIG. 1A. As a result, the area of each of the opposed top and bottom surfaces of the first plated layer 114 is at least equal and preferably larger than that of the first surface 111 of the die pad 110. As will be discussed in more detail below, the protrusion of the first plated layer 114 beyond the peripheral edge of the first surface 111 is used to provide increased bonding power (i.e., a firmer mechanical interlock) between the die pad 110 and a package body of the semiconductor package 100. The first plated layer 114 also provides an optimal bonding surface for one or more conductive wires extending from the semiconductor die of the semiconductor package 100 as will also be discussed in more detail below.

In addition to the first plated layer 114 formed on the first surface 111 thereof, the die pad 110 of the semiconductor package 100 includes a second plated layer 115 which is formed on the second surface 112 thereof in a predetermined thickness. As is also seen in FIG. 1A, the areas of the top and bottom surfaces of the second plated layer 115 are each substantially equal to that of the second surface 112, i.e, the second plated layer 115 extends to, but does not protrude beyond, the periphery of the second surface 112. As an alternative to the second plated layer 115, it is contemplated that an environment-friendly organic solderability preservation material (hereinafter referred to as an "OSP") may be formed on the second surface 112 of the die pad 110. The OSP functions to prevent oxidation of the die pad 110 until the semiconductor package 100 is mounted to an external device. Since the OSP is volatilized and removed during the high temperature mounting process typically used to facilitate the attachment of the semiconductor package 100 to an external device, such OSP would not disturb the process of mounting the die pad 110 of the semiconductor package 100 to the external device.

In addition to the die pad 110, the semiconductor package 100 comprises a conductive ring 120 which extends about or circumvents the die pad 110, i.e., the die pad 110 resides in the open interior of the conductive ring 120. The conductive ring 120 substantially functions as a ground ring or a power ring in the semiconductor package 100. The conductive ring 120 defines a generally planar first (top) surface 121, and an opposed, generally planar second (bottom) surface 122. Extending between the first and second surfaces 121, 122 is a third (side) surface 123. As best seen in FIG. 1A, the third surface 123 does not extend perpendicularly between the first and second surfaces 121, 122. Rather, the third surface 123 extends at an incline or angle between the first and second surfaces 121, 122. As a result, the area of the first surface 121 is smaller than that of the second surface 122. It is contemplated that the conductive ring 120 may be formed from any one of a number of suitable conductive metal materials, including copper or an equivalent material, though the present invention is not intended to be limited to any specific material for the conductive ring 120. As will be discussed in more detail below, since the conductive ring 120 is preferably formed of a conductive metal material, such conductive ring 120 may be used to transfer an electrical signal from a semiconductor die (e.g., a ground signal or a power signal) to the exterior of the semiconductor package 100, and may further be used to emit heat generated from the semiconductor die of the semiconductor package 100.

As is further seen in FIG. 1A, formed on the first surface 111 of the conductive ring 120 is a first plated layer 124 which is of a predetermined thickness. Importantly, the first plated layer 124 is sized so as to protrude beyond the inner and outer peripheral edges of the first surface 121 by a predetermined length or distance in a horizontal direction as viewed from the perspective shown in FIG. 1A. As a result, the area of each of the opposed top and bottom surfaces of the first plated layer 124 is at least equal and preferably larger than that of the first surface 121 of the conductive ring 120. As will be discussed in more detail below, the protrusion of the first plated layer 124 beyond the inner and outer peripheral edges of the first surface 121 is used to provide increased bonding power (i.e., a firmer mechanical interlock) between the conductive ring 120 and a package body of the semiconductor package 100. The first plated layer 124 also provides an optimal bonding surface for one or more conductive wires extending from the semiconductor die of the semiconductor package 100 as will also be discussed in more detail below.

In addition to the first plated layer 124 formed on the first surface 121 thereof, the conductive ring 120 of the semiconductor package 100 includes a second plated layer 125 which is formed on the second surface 122 thereof in a predetermined thickness. As is also seen in FIG. 1A, the areas of the top and bottom surfaces of the second plated layer 125 are each substantially equal to that of the second surface 122, i.e, the second plated layer 125 extends to, but does not protrude beyond, the inner and outer peripheral edges of the second surface 122. As an alternative to the second plated layer 125, it is contemplated that the above-described OSP may be formed on the second surface 122 of the conductive ring 120. The OSP functions to prevent oxidation of the conductive ring 120 until the semiconductor package 100 is mounted to an external device. Since the OSP is volatilized and removed during the high temperature mounting process typically used to facilitate the attachment of the semiconductor package 100 to an external device, such OSP would not disturb the process of mounting the conductive ring 120 of the semiconductor package 100 to the external device.

The semiconductor package 100 further comprises a plurality of I/O pads 130 which extend about or circumvent the conductive ring 120. More particularly, as seen in FIG. 1B, the I/O pads 130 are segregated into a first inner set which at least partially circumvents the conductive ring 120, and a second outer set which at least partially circumvents the inner set. Each of the I/O pads 130 defines a generally planar first (top) surface 131, and an opposed, generally planar second (bottom) surface 132. Extending between the first and second surfaces 131, 132 is a third (side) surface 133. As best seen in FIG. 1A, the third surface 133 does not extend perpendicularly between the first and second surfaces 131, 132. Rather, the third surface 133 extends at an incline or angle between the first and second surfaces 131, 132. As a result, the area of the first surface 131 is smaller than that of the second surface 132. It is contemplated that each of the I/O pads 130 may be formed from any one of a number of suitable conductive metal materials, including copper or an equivalent material, though the present invention is not intended to be limited to any specific material for the I/O pads 130. As will be discussed in more detail below, since each of the I/O pads 130 is preferably formed of a conductive metal material, such I/O pads 130 may be used to transfer an electrical signal from a semiconductor die (e.g., a ground signal or a power signal) to the exterior of the semiconductor package 100, and may further be used to emit heat generated from the semiconductor die of the semiconductor package 100.

As is further seen in FIG. 1A, formed on the first surface 131 of each of the I/O pads 130 is a first plated layer 134 which is of a predetermined thickness. Importantly, the first plated layer 134 is sized so as to protrude beyond the periphery of the first surface 131 by a predetermined length or distance in a horizontal direction as viewed from the perspective shown in FIG. 1A. As a result, the area of each of the opposed top and bottom surfaces of each of the first plated layers 134 is at least equal and preferably larger than that of the first surface 131 of the corresponding I/O pad 130 to which it is applied. As will be discussed in more detail below, the protrusion of the first plated layer 134 beyond the peripheral edge of the first surface 131 is used to provide increased bonding power (i.e., a firmer mechanical interlock) between the corresponding I/O pad 130 and a package body of the semiconductor package 100. The first plated layer 134 also provides an optimal bonding surface for one or more conductive wires extending from the semiconductor die of the semiconductor package 100 as will also be discussed in more detail below.

In addition to the first plated layer 134 formed on the first surface 131 thereof, each of the I/O pads 130 of the semiconductor package 100 includes a second plated layer 135 which is formed on the second surface 132 thereof in a predetermined thickness. As is also seen in FIG. 1A, the areas of the top and bottom surfaces of the second plated layer 135 are each substantially equal to that of the second surface 132, i.e., the second plated layer 135 extends to, but does not protrude beyond, the peripheral edge of the corresponding second surface 132. As an alternative to the second plated layer 135, it is contemplated that the above-described OSP may be formed on the second surface 132 of each of the I/O pads 130. The OSP functions to prevent oxidation of the corresponding I/O pad 130 until the semiconductor package 100 is mounted to an external device. Since the OSP is volatilized and removed during the high temperature mounting process typically used to facilitate the attachment of the semiconductor package 100 to an external device, such OSP would not disturb the process of mounting the I/O pad 130 of the semiconductor package 100 to which it is applied to the external device.

Those of ordinary skill in the art will recognize that the number and arrangement of the I/O pads 130 as shown in FIGS. 1A and 1B is exemplary only, and that I/O pads 130 provided in differing numbers or arrangements are contemplated to be within the spirit and scope of the present invention. For example, the I/O pads 130 may be arranged as a single set which at least partially circumvents the conductive ring 120, or as inner, middle and outer sets which are concentrically arranged about the conductive ring 120.

The semiconductor package 100 of the present invention further comprises a semiconductor die 140 which is attached to the top surface of the first plating layer 114 applied to the die pad 110. The semiconductor die 140 defines a generally planar first (top) surface 141, and an opposed, generally planar second (bottom) surface 142. Extending generally perpendicularly between the first and second surfaces 141, 142 is a third (side) surface 143. Formed on the first surface 141 in close proximity to the peripheral edge thereof is a plurality of bonding pads 144 of the semiconductor die 140. The semiconductor die 140 is adhered to the first plated layer 114 formed on the die pad 110 through the use of an adhesive layer 150. The adhesive layer 150 may comprise a general liquid epoxy adhesive, a both-side adhesive tape, or any other suitable equivalent material, the present invention not being limited to any particular material for the adhesive layer 150. As is seen in FIG. 1A, the width of the semiconductor die 140 is preferably smaller than that of the die pad 110, and in particular the first plated layer 114 formed thereon, for purposes which will be described in more detail below.

In the semiconductor package 100, at least one first conductive wire 160 is used to electrically connect the semiconductor die 140 to the die pad 110. More particularly, a first conductive wire 160 extends between a respective one of the bonding pads 144 of the semiconductor die 140 and the top surface of the first plated layer 114 formed on the die pad 110. Importantly, the reduced width of the semiconductor die 140 in comparison to that of the first plated layer 114 provides sufficient space to accommodate that end of the first conductive wire 160 which is extended and bonded to the first plated layer 114. The first conductive wire(s) 160 may be used to cause the ground signal of the semiconductor die 140 to be transferred to the die pad 110. Further, the first conductive wire(s) 160 may be used to cause the power signal from an external source to be transferred to the semiconductor die 140 through the die pad 110. The first conductive wire(s) 160 may comprise a gold wire, an aluminum wire, a copper wire, or an equivalent material, the present invention not being limited to any specific material for the conductive wire(s) 160.

In addition to the first conductive wire(s) 160, the semiconductor package 100 includes at least one second conductive wire 170 which is used to electrically connect the semiconductor die 140 to the conductive ring 120. More particularly, the second conductive wire 170 extends between and electrically connects a respective one of the bonding pads 144 of the semiconductor die 140 to the first plated layer 124 formed on the conductive ring 120. The second conductive wire(s) 170 may be used to cause the ground signal of the semiconductor die 140 to be transferred to the conductive ring 120. The second conductive wire(s) 170 may also be used to cause the power signal from an external source to be transferred to the semiconductor die 140 through the conductive ring 120. The second conductive wire(s) 170 may be fabricated from any one of the materials described above in relation to the first conductive wire(s) 160.

In addition to the first and second conductive wires 160, 170, the semiconductor package 100 further comprises at least one third conductive wire 180 which is used to electrically connect the semiconductor die 140 to at least one of the I/O pads 130. It is contemplated that the semiconductor package 100 will include a plurality of conductive wires 180 which are used to electrically connect each of the I/O pads 130 included in the semiconductor package 100 to respective ones of the bonding pads 144 of the semiconductor die 140. More particularly, as is further seen in FIG. 1A, each of the conductive wires 180 extends between one of the bonding pads 144 and the first plated layer 134 formed on a respective one of the I/O pads 130. The third conductive wires 180 may be used to cause the control signals or the communication signals of the semiconductor die 140 to be transferred to each of the I/O pads 130. The third conductive wires 180 may also be used to cause the control signal or the communication signal from an external source to be transferred to the semiconductor die 140 through one or more of the I/O pads 130. The third conductive wires 180 are also each preferably fabricated from one of the above-described materials used in relation to the conductive wires 160, 170.

In the semiconductor package 100, portions of the die pad 110, conductive ring 120, I/O pads 130, first plated layers 114, 124, 134, conductive wires 160, 170, 180, and semiconductor die 140 are covered by an encapsulant material which hardens into a package body 190 of the semiconductor package 100. The package body 190 defines a generally planar first (top) surface 191, and an opposed, generally planar second (bottom) surface 192. Extending generally perpendicularly between the first and second surfaces 191, 192 is a third (side) surface 193. As is best seen in FIG. 1A, in fabricating the semiconductor package 100, it is contemplated that the second plated layer 115 (or OSP) formed on the die pad 110, the second plated layer 125 (or OSP) formed on the conductive ring 120, and the second plated layer 135 (or OSP) formed on each of the I/O pads 130 will be exposed in and protrude outwardly from the second surface 192 of the package body 190. As a result, the die pad 110, the conductive ring 120, and each of the I/O pads 130 may be easily mounted to an external device. Those of ordinary skill in the art will recognize that if the second plated layers 115, 125, 135 or the OSP's are not formed on respective ones of the die pad 110, the conductive ring 120 and the I/O pads 130, each of the second surfaces 112, 122, 132 will be exposed in and extend in substantially flush relation to the second surface 192 of the package body 190.

As is further seen in FIG. 1, the encapsulant material used to form the package body 190 also underfills those portions of the first plated layers 114, 124, 134 which overhang corresponding ones of the first surfaces 111, 121, 131. As indicated above, such underfill assists in providing a firm mechanical interlock between the package body 190 and the die pad 110, conductive ring 120 and I/O pads 130. It is contemplated that the encapsulant used to form the package body 190 may comprise an epoxy compound that performs the encapsulation through a molding process, a liquid encapsulant that performs the encapsulation through a dispenser, or equivalent materials thereto, the present invention not being limited to any specific material for the encapsulant.

As indicated above, in the semiconductor package 100, the die pad 110 is generally used to transfer the ground signal or the power signal of the semiconductor die 140 inside or outside the semiconductor package 100, and is further used to emit heat generated by the semiconductor die 140 to the outside of the semiconductor package 100. Similarly, the conductive ring 120 is generally used to transfer the ground signal or the power signal of the semiconductor die 140 inside or outside the semiconductor package 100. The I/O pads 130 are generally used to transfer the control signal or the communication of the semiconductor die 140 inside or outside the semiconductor package 100.

Figure 2A:
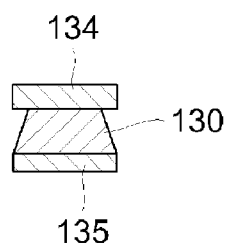
FIGS. 2A-2C are cross-sectional views illustrating contemplated variants of first plating layers which may be applied to the I/O pads of the semiconductor package of the first embodiment shown in FIGS. 1A and 1B.
Figure 2B:
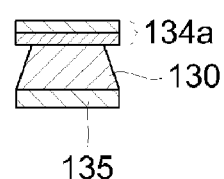
Figure 2C:
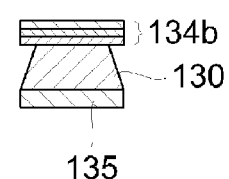

FIG. 2A depicts one of the I/O pads 130 of the semiconductor package 100, including the first and second plated layers 134, 135 formed thereon. In the semiconductor package 100, it is contemplated that the first plated layer 134 of each I/O pad 130 may comprise electrolytic Ag, direct immersion Au, and suitable equivalent materials. Referring now to FIG. 2B, it is contemplated that the first plated layer 134 may be substituted with a variant first plated layer 134a which may comprise adjacent layers of electrolytic Ni and electrolytic Au, adjacent layers of electroless Ni and electroless Au, adjacent layers of electroless Ni and immersion Au, adjacent layers of electroless Ni and autocatalysis Au, and suitable equivalent materials. As shown in FIG. 2C, it is further contemplated that the first plated layer 134 may also be substituted with a variant first plated layer 134b which may comprise three adjacent layers of electroless Ni, electroless Pd and immersion Au, and suitable equivalent materials. Importantly, the above-described first plated layers 134, 134a, 134b may be varied according to the size of the semiconductor package 100, the price of the semiconductor package 100, the kind of conductive wire(s) 180 used in the semiconductor package 100, the kind of encapsulant used to form the package body 190, and a plurality of other variables. Thus, the size of material used in relation to the first plated layers 134, 134a, 134b is not intended to be limited in the present invention.

Figure 3A:
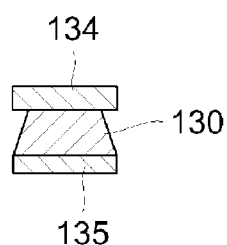
FIGS. 3A-3C are cross-sectional views illustrating contemplated variants of second plating layers which may be applied to the I/O pads of the semiconductor package of the first embodiment shown in FIGS. 1A and 1B.
Figure 3B:
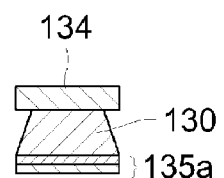
Figure 3C:
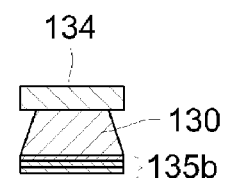

FIG. 3A, like FIG. 2A, depicts one of the I/O pads 130 of the semiconductor package 100, including the first and second plated layers 134, 135 formed thereon. In the semiconductor package 100, it is contemplated that the second plated layer 135 of each I/O pad 130 may comprise immersion Sn, direct immersion Au, OSP, and suitable equivalent materials. Referring now to FIG. 3B, it is contemplated that the second plated layer 135 may be substituted with a variant second plated layer 135a which may comprise adjacent layers of electroless Ni and electroless Au, and suitable equivalent materials. As shown in FIG. 3C, it is further contemplated that the second plated layer 135 may also be substituted with a variant second plated layer 135b which may comprise three adjacent layers of electroless Ni, electroless Pd and immersion Au, adjacent layers of electroless Ni and immersion Au, adjacent layers of electroless Ni and autocatalysis Au, and suitable equivalent materials. Importantly, the above-described second plated layers 135, 135a, 135b may be varied according to the size of the semiconductor package 100, the price of the semiconductor package 100, the mounting environment for the semiconductor package 100, and a plurality of other variables. Thus, the size of material used in relation to the first plated layers 135, 135a, 135b is not intended to be limited in the present invention.

Figure 4:
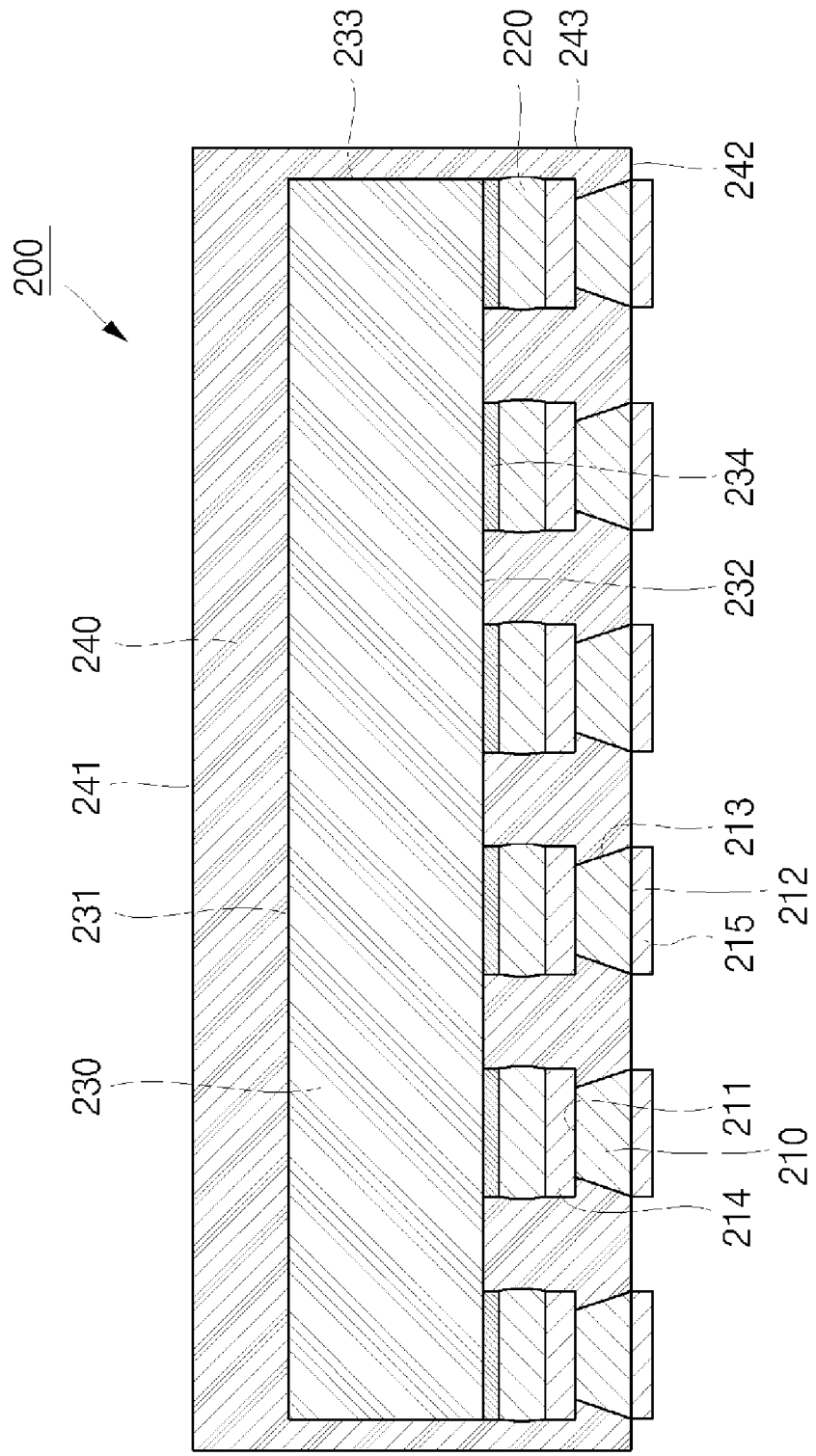
FIG. 4 is a cross-sectional view of a semiconductor package constructed in accordance with a second embodiment of the present invention.

Referring now to FIG. 4, there is shown a semiconductor package 200 constructed in accordance with a second embodiment of the present invention. The semiconductor package 200 comprises a plurality of I/O pads 210. Each of the I/O pads 210 defines a generally planar first (top) surface 211, and an opposed, generally planar second (bottom) surface 212. Extending between the first and second surfaces 131, 132 is a third (side) surface 213. As best seen in FIG. 4, the third surface 213 does not extend perpendicularly between the first and second surfaces 211, 212. Rather, the third surface 213 extends at an incline or angle between the first and second surfaces 211, 212. As a result, the area of the first surface 211 is smaller than that of the second surface 212. It is contemplated that each of the I/O pads 210 may be formed from any one of a number of suitable conductive metal materials, including copper or an equivalent material, though the present invention is not intended to be limited to any specific material for the I/O pads 210. As will be discussed in more detail below, since each of the I/O pads 210 is preferably formed of a conductive metal material, such I/O pads 210 may be used to transfer an electrical signal from a semiconductor die (e.g., a ground signal or a power signal) to the exterior of the semiconductor package 200, and may further be used to emit heat generated from the semiconductor die of the semiconductor package 200.

As is further seen in FIG. 4, formed on the first surface 211 of each of the I/O pads 210 is a first plated layer 214 which is of a predetermined thickness. Importantly, the first plated layer 214 is sized so as to protrude beyond the periphery of the first surface 211 by a predetermined length or distance in a horizontal direction as viewed from the perspective shown in FIG. 4. As a result, the area of each of the opposed top and bottom surfaces of each of the first plated layers 214 is at least equal and preferably larger than that of the first surface 211 of the corresponding I/O pad 210 to which it is applied. As will be discussed in more detail below, the protrusion of the first plated layer 214 beyond the peripheral edge of the first surface 211 is used to provide increased bonding power (i.e., a firmer mechanical interlock) between the corresponding I/O pad 210 and a package body of the semiconductor package 200.

In addition to the first plated layer 214 formed on the first surface 211 thereof, each of the I/O pads 210 of the semiconductor package 200 includes a second plated layer 215 which is formed on the second surface 212 thereof in a predetermined thickness. As is also seen in FIG. 4, the areas of the top and bottom surfaces of the second plated layer 215 are each substantially equal to that of the second surface 212, i.e., the second plated layer 215 extends to, but does not protrude beyond, the peripheral edge of the corresponding second surface 212. As an alternative to the second plated layer 212, it is contemplated that the above-described OSP may be formed on the second surface 212 of each of the I/O pads 210. The OSP functions to prevent oxidation of the corresponding I/O pad 210 until the semiconductor package 200 is mounted to an external device. Since the OSP is volatilized and removed during the high temperature mounting process typically used to facilitate the attachment of the semiconductor package 200 to an external device, such OSP would not disturb the process of mounting the I/O pad 210 of the semiconductor package 200 to which it is applied to the external device. Those of ordinary skill in the art will recognize that the I/O pads 210 of the semiconductor package 200 may be provided in any number and arrangement without departing from the spirit and scope of the present invention.

The semiconductor package 200 of the present invention further comprises a semiconductor die 230. The semiconductor die 230 defines a generally planar first (top) surface 231, and an opposed, generally planar second (bottom) surface 232. Extending generally perpendicularly between the first and second surfaces 231, 232 is a third (side) surface 233. Formed on the second surface 232 is a plurality of bonding pads 234 of the semiconductor die 230. In the semiconductor package 200, each of the bonding pads 234 is electrically connected to the first plated layer 214 of a respective one of the I/O pads 210. Such electrical connection is preferably facilitated by a conductive bump 220 which is interposed between each of the bonding pads 234 and respective ones of the first plated layers 214 in the manner shown in FIG. 4. More particularly, each conductive bump 220 is melted so as to effectively join and thus electrically connect each first plated layer 214 to a corresponding one of the bonding pads 234. As such, the conductive bumps 220 function to electrically connect the semiconductor die 230 to the I/O pads 210 in an arrangement commonly referred to as flip chip type connection. Each conductive bump 220 may comprise gold, silver, solder, leadless solder, anisotropic conductive film, and suitable equivalent materials, the present invention not being limited to any particular material for the conductive bumps 220.

In the semiconductor package 200, portions of the I/O pads 210, first plated layers 214, conductive bumps 220 and semiconductor die 230 are covered by an encapsulant material which hardens into a package body 240 of the semiconductor package 200. The package body 240 defines a generally planar first (top) surface 241, and an opposed, generally planar second (bottom) surface 242. Extending generally perpendicularly between the first and second surfaces 241, 242 is a third (side) surface 243. As is best seen in FIG. 4, in fabricating the semiconductor package 200, it is contemplated that the second plated layer 215 (or OSP) formed on each of the I/O pads 210 will be exposed in and protrude outwardly from the second surface 242 of the package body 240. As a result, each of the I/O pads 210 may be easily mounted to an external device. Those of ordinary skill in the art will recognize that if the second plated layers 215 or the OSP's are not formed on respective ones of the I/O pads 210, each of the second surfaces 212 will be exposed in and extend in substantially flush relation to the second surface 242 of the package body 240.

As is further seen in FIG. 4, the encapsulant material used to form the package body 240 also underfills those portions of the first plated layers 214 which overhang corresponding ones of the first surfaces 211. As indicated above, such underfill assists in providing a firm mechanical interlock between the package body 240 and the I/O pads 210. It is contemplated that the encapsulant used to form the package body 240 may comprise an epoxy compound that performs the encapsulation through a molding process, a liquid encapsulant that performs the encapsulation through a dispenser, or equivalent materials thereto, the present invention not being limited to any specific material for the encapsulant.

Referring now to FIGS. 5A-5M, there is shown an exemplary sequence of steps which may be used to facilitate the fabrication of multiple semiconductor packages 100. Though the fabrication process described below in relation to FIGS. 5A-5M is depicted as being implemented in relation to the simultaneous fabrication of two semiconductor packages 100, those of ordinary skill in the art will recognize that such process is also applicable to the fabrication of a single semiconductor package 100, or to the simultaneous fabrication of more than two semiconductor packages 100 without departing from the spirit and scope of the present invention.

Figure 5A:
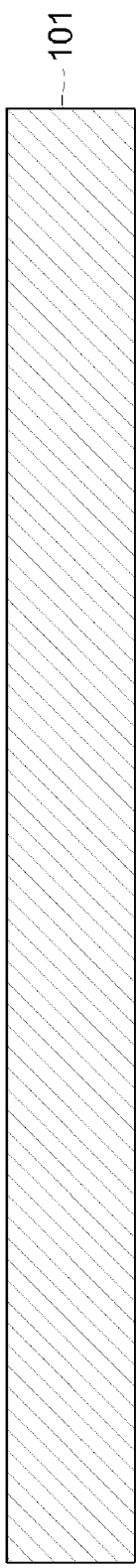

In the initial step of the fabrication process shown in FIG. 5A, a carrier 101 is prepared. The carrier 101 is preferably fabricated from a material which is capable of maintaining a predetermined stiffness so as not to be susceptible to warpage during the process of fabricating the semiconductor packages 100. The carrier 101 is further preferably fabricated from a material which is capable of being removed by an etching liquid or etchant during the process of fabricating the semiconductor packages 100. In this regard, it is contemplated that the carrier 101 will be formed of a metal such as, for example, copper or a suitable equivalent material. However, the present invention is not intended to be limited to any particular material for the carrier 101.

Figure 5B:
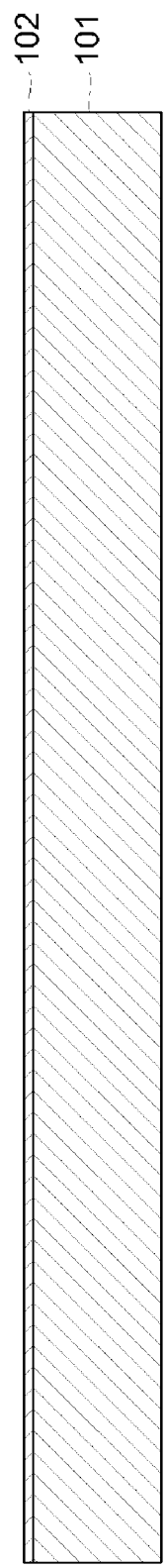

In the next step of the fabrication process shown in FIG. 5B, a barrier layer 102 is formed on the top surface of the carrier 101. It is contemplated that the barrier layer 102 will be fabricated from a material which is resistant to being etched by etching liquids which are adapted to etch other components such as the copper carrier 101 during the process of fabricating the semiconductor packages 100. The barrier layer 102 may be formed of, for example, nickel or a suitable equivalent material. In this regard, nickel is a suitable material for the barrier layer 102 since it does not react with an etching liquid which is otherwise suitable to etch copper. However, the present invention is not intended to be limited to any particular material for use in relation to the barrier layer 102. The barrier layer 102 may be formed by plating nickel having a predetermined thickness on the top surface of the carrier 101 as shown in FIG. 5B.

Figure 5C:
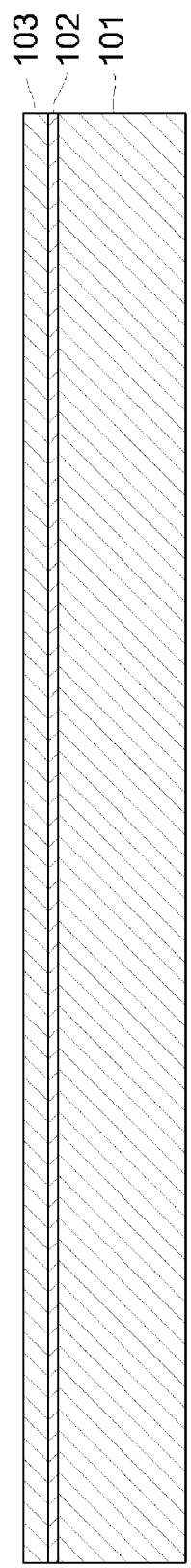

In the next step of the fabrication process shown in FIG. 5C, a pad layer 103 is formed on the barrier layer 102. As will be discussed in more detail below, the pad layer 103 is eventually etched in a manner facilitating the formation of the die pad 110, the conductive ring 120, and the I/O pads 130 of each semiconductor package 100. As such, it is contemplated that the pad layer 103 will be fabricated from a material having excellent electrical conductivity and thermal conductivity. For example, copper or a suitable equivalent material may be used as the material for forming the pad layer 103. However, the present invention is not intended to be limited to be any specific material for the pad layer 103. The pad layer 103 may be formed by plating copper having a predetermined thickness on the barrier layer 102 in the manner shown in FIG. 5C.

Figure 5D:
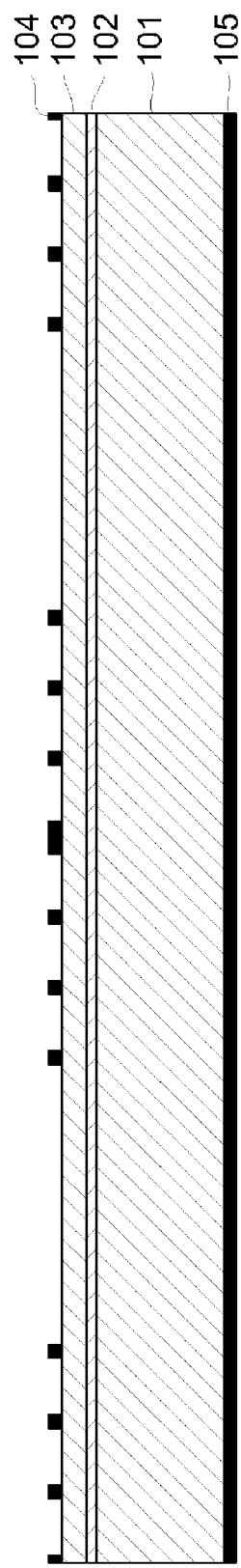

In the next step of the fabrication process shown in FIG. 5D, a first dry film 104 is applied to the pad layer 103, with a second dry film 105 being applied to the bottom surface of the carrier 101, i.e., that surface of the carrier 101 opposite that having the barrier layer 102 applied thereto. As seen in FIG. 5D, the second dry film 105 is substantially continuous, and covers the entirety of the bottom surface of the carrier 101. In contrast, the first dry film 104 applied to the pad layer 103 is exposed and developed in a manner forming a predetermined pattern. Such pattern is one which will ultimately define the die pads 110, conductive rings 120 and I/O pads 130 of multiple semiconductor packages 100.

In the next step of the fabrication process shown in FIG. 5E, the first plated layers 114, 124, 134 are formed by applying any of the suitable materials described above in relation to FIGS. 2A-2C onto those portions of the exposed surface of the pad layer 103 which are not covered by the patterned first dry film 104. After the first plated layers 114, 124, 134 are formed, the first dry film 104 is removed, thus facilitating formation of spaces or voids between the fully formed first plated layers 114, 124, 134 in the manner shown FIG. 5E.

In the next step of the fabrication process shown in FIG. 5F, an etching process is performed by using the first plated layers 114, 124, 134 as a mask such that the die pad 110, the conductive ring 120, and the I/O pads 130 of each of the semiconductor packages 100 are formed and separated from each other. More particularly, the etching liquid used in the etching process shown in FIG. 5F is preferably one which will not react with the first plated layers 114, 124, 134, or the barrier layer 102. Thus, the etching liquid reacts only with the material used to form the pad layer 103. As a result of the completion of the etching process in the manner shown in FIG. 5F, the barrier layer 102 is effectively exposed between the resultant die pads 110, conductive rings 120 and I/O pads 130. Additionally, in the etching process, it is contemplated that each of the die pads 110, conductive rings 120 and I/O pads 130 will be slightly over etched by the etching liquid, thereby forming the above-described inclined third surfaces 113, 123, 133 thereon and further resulting in the first plated layers 114, 124, 134 horizontally protruding therefrom in the manner facilitating the creation of the above-described overhang structure. Upon the completion of the etching of the pad layer 103, the second dry film 105 is removed from the bottom surface of the carrier 101.

In the next step of the fabrication process shown in FIG. 5G, a semiconductor die 140 is attached to each of the die pads 110 formed as a result of the etching of the pad layer 103 in the manner described above in relation to FIG. 5F. As indicated above, each of the semiconductor dies 104 is attached to the first plated layer 114 formed on a respective one of the die pads 110 through the use of an adhesive layer 150. The attachment of the semiconductor dies 140 to respective ones of the die pads 110 may be implemented through the use of a die bonder.

In the next step of the fabrication process shown in FIG. 5H, each semiconductor die 140 is electrically connected to the die pad 110, the conductive ring 120 and the I/O pads 130 of the corresponding semiconductor package 100 through the use of the above-described first, second and third conductive wires 160, 170, 180. More particularly, the first conductive wires 160 are extended from respective ones of the bonding pads 144 of the semiconductor die 140 to the first plated layer 114 formed on the corresponding die pad 110. The second conductive wires 170 are extended from respective ones of the bonding pads 144 of the semiconductor die 140 to the first plated layer 124 formed on the corresponding conductive ring 120. Finally, the conductive wires 180 are extended from respective ones of the bonding pads 144 of the semiconductor die 140 to the first plated layers 134 formed on corresponding ones of the I/O pads 130. The bonding of the bond wires 160, 170, 180 in the above-described manner may be implemented through the use of a wire bonder.

In the next step of the fabrication process shown in FIG. 5I, the package bodies 190 of the semiconductor packages 100 are formed by applying a layer of encapsulant material over the semiconductor dies 140, the conductive wires 160, 170, 180, the first plated layers 114, 124, 134, the die pads 110, the conductive rings 120, and the I/O pads 130. As seen in FIG. 5I, such encapsulant material also flows into direct contact with those portions of the barrier layer 102 exposed as a result of the etching of the pad layer 103 to form the die pads 110, conductive rings 120 and I/O pads 130.

In the next step of the fabrication process shown in FIG. 5J, the carrier 101 is removed. The removal of the carrier 101 is preferably facilitated by an etching process through the use of a suitable etching liquid. Since the etching liquid preferably used to etch the carrier 101 does not react with the barrier layer 102, the barrier layer 102 is exposed upon the removal of the carrier 101.

In the step of the fabrication process shown in FIG. 5K, the barrier layer 102 is etched and completely removed through the use of a suitable etching liquid. However, as will be described in more detail below, the barrier layer 102 may only be partially removed. In the event the barrier layer 102 is to be completely removed, the etching liquid used to etch the barrier layer 102 is one which does not react with the previously formed die pads 110, conductive pads 120 and I/O pads 130. The etching liquid is also one which does not react with the encapsulant material used to form the integrally connected package bodies 190. Upon the etching and removal of the barrier layer 102, the second surfaces 112, 122, 132 of the die pads 110, conductive rings 120 and I/O pads 130 are exposed in the bottom surfaces of respective ones of the integrally connected package bodies 190 formed from the hardened encapsulant material in the manner shown in FIG. 5K.

In the next step of the fabrication process shown in FIG. 5L, the second plated layers 115, 125, 135 are formed on the second surfaces 112, 122, 132 of respective ones of the die pads 110, conductive rings 120 and I/O pads 130. The second plated layers 115, 125, 135 are formed by applying any of the suitable materials described above in relation to FIGS. 3A-3C onto the second surfaces 112, 122, 132 of respective ones of the die pads 110, conductive rings 120 and I/O pads 130. As indicated above, the fully formed second plated layers 115, 125, 135 typically protrude downwardly from the bottom surfaces 192 of the integrally connected package bodies 190 formed by the hardened encapsulant material. As also indicated above, the step of forming the second plated layers 115, 125, 135 as shown in FIG. 5L may be substituted with the formation of the above-described OSP's on the second surface 112 of each die pad 110, the second surface 122 of each conductive ring 120, and the second surface 132 of each I/O pad 130.

In the final step of the fabrication process shown in FIG. 5M, a singulation process is conducted to separate the fully formed semiconductor packages 100 from each other. In the singulation process, the hardened encapsulant material is sawed in a manner forming the separate package bodies 190 of the semiconductor packages 100. The sawing process may be completed through the use of, for example, a sawing tool 106. Any surface of each package body 190 may be marking-processed by laser or ink before the performance of the singulation process.

Referring now to FIG. 6A, as indicated above in relation to FIG. 5K, the barrier layer 102 may be partially removed through the completion of a suitable etching process as opposed to being completely removed. In order to facilitate such partial etching of the barrier layer 102, a dry film 104 may be applied to the exposed surface of the barrier layer 102, with the dry film 104 thereafter being patterned in the manner shown in FIG. 6A. Upon the patterning thereof, the dry film 104 partially remains on the bottom surface of the barrier layer 102, and covers areas corresponding to the second surface 112 of each of the die pads 110, the second surface 122 of each of the conductive rings 120, and the second surface 132 of each of the I/O pads 130. As shown in FIG. 6B, subsequent to the patterning of the dry film 104, an etching process is completed, with the remaining dry film 104 functioning as a mask in a manner allowing for the etching of the barrier layer 102 in a manner forming the second plated layers 115, 125, 135. Thus, the fabrication steps shown in FIGS. 6A and 6B may be implemented as an alternative to the fabrication steps shown and described above in relation to FIGS. 5K and 5L.

Referring now to FIGS. 7A-7M, there is shown an exemplary sequence of steps which may be used to facilitate the fabrication of multiple semiconductor packages 200. Though the fabrication process described below in relation to FIGS. 7A-7M is depicted as being implemented in relation to the simultaneous fabrication of two semiconductor packages 200, those of ordinary skill in the art will recognize that such process is also applicable to the fabrication of a single semiconductor package 200, or to the simultaneous fabrication of more than two semiconductor packages 200 without departing from the spirit and scope of the present invention.

Figure 7A:

In the initial step of the fabrication process shown in FIG. 7A, a carrier 201 is prepared. The carrier 201 is preferably fabricated from a material which is capable of maintaining a predetermined stiffness so as not to be susceptible to warpage during the process of fabricating the semiconductor packages 200. The carrier 201 is further preferably fabricated from a material which is capable of being removed by an etching liquid or etchant during the process of fabricating the semiconductor packages 200. In this regard, it is contemplated that the carrier 201 will be formed of a metal such as, for example, copper or a suitable equivalent material. However, the present invention is not intended to be limited to any particular material for the carrier 201.

Figure 7B:
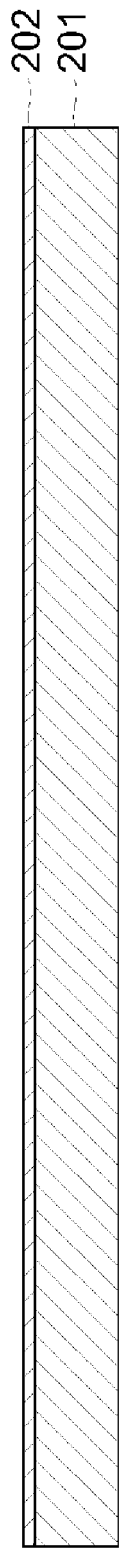

In the next step of the fabrication process shown in FIG. 7B, a barrier layer 202 is formed on the top surface of the carrier 201. It is contemplated that the barrier layer 202 will be fabricated from a material which is resistant to being etched by etching liquids which are adapted to etch other components such as the copper carrier 201 during the process of fabricating the semiconductor packages 200. The barrier layer 202 may be formed of, for example, nickel or a suitable equivalent material. In this regard, nickel is a suitable material for the barrier layer 202 since it does not react with an etching liquid which is otherwise suitable to etch copper. However, the present invention is not intended to be limited to any particular material for use in relation to the barrier layer 202. The barrier layer 202 may be formed by plating nickel having a predetermined thickness on the top surface of the carrier 201 as shown in FIG. 7B.

Figure 7C:
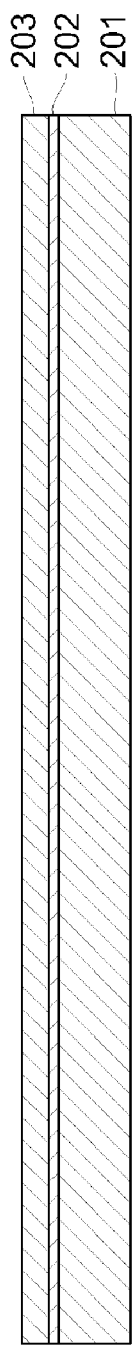

In the next step of the fabrication process shown in FIG. 7C, a pad layer 203 is formed on the barrier layer 202. As will be discussed in more detail below, the pad layer 103 is eventually etched in a manner facilitating the formation of the I/O pads 210 of each semiconductor package 200. As such, it is contemplated that the pad layer 203 will be fabricated from a material having excellent electrical conductivity and thermal conductivity. For example, copper or a suitable equivalent material may be used as the material for forming the pad layer 203. However, the present invention is not intended to be limited to be any specific material for the pad layer 203. The pad layer 203 may be formed by plating copper having a predetermined thickness on the barrier layer 202 in the manner shown in FIG. 7C.

Figure 7D:
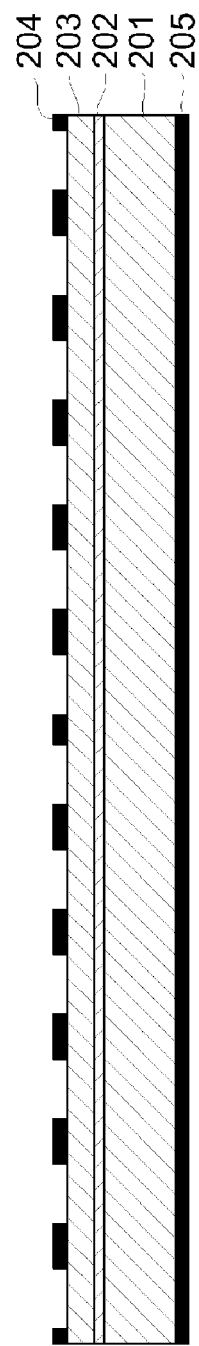

In the next step of the fabrication process shown in FIG. 7D, a first dry film 204 is applied to the pad layer 203, with a second dry film 205 being applied to the bottom surface of the carrier 201, i.e., that surface of the carrier 201 opposite that having the barrier layer 202 applied thereto. As seen in FIG. 7D, the second dry film 205 is substantially continuous, and covers the entirety of the bottom surface of the carrier 201. In contrast, the first dry film 204 applied to the pad layer 203 is exposed and developed in a manner forming a predetermined pattern. Such pattern is one which will ultimately define the I/O pads 210 of multiple semiconductor packages 200.

In the next step of the fabrication process shown in FIG. 7E, the first plated layers 214 are formed by applying any of the suitable materials described above in relation to FIGS. 2A-2C onto those portions of the exposed surface of the pad layer 203 which are not covered by the patterned first dry film 204. After the first plated layers 214 are formed, the first dry film 204 is removed, thus facilitating formation of spaces or voids between the fully formed first plated layers 214 in the manner shown FIG. 7E.

In the next step of the fabrication process shown in FIG. 7F, an etching process is performed by using the first plated layers 214 as a mask such that the I/O pads 210 of each of the semiconductor packages 200 are formed and separated from each other. More particularly, the etching liquid used in the etching process shown in FIG. 7F is preferably one which will not react with the first plated layers 214, or the barrier layer 202. Thus, the etching liquid reacts only with the material used to form the pad layer 203. As a result of the completion of the etching process in the manner shown in FIG. 7F, the barrier layer 202 is effectively exposed between the resultant I/O pads 210. Additionally, in the etching process, it is contemplated that each of the I/O pads 210 will be slightly over etched by the etching liquid, thereby forming the above-described inclined third surfaces 213 thereon and further resulting in the first plated layers 214 horizontally protruding therefrom in the manner facilitating the creation of the above-described overhang structure. Upon the completion of the etching of the pad layer 203, the second dry film 205 is removed from the bottom surface of the carrier 201.

Figure 7G:
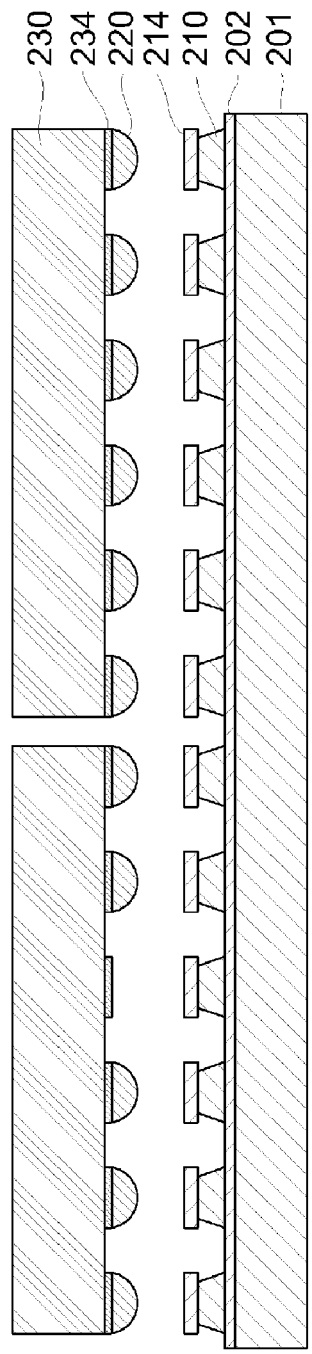

In the next step of the fabrication process shown in FIG. 7G, a semiconductor die 230 is attached and electrically connected to each of the I/O pads 210 of the corresponding semiconductor package 200, such I/O pads 210 being formed as a result of the etching of the pad layer 203 in the manner described above in relation to FIG. 7F. Each of the bonding pads 234 of each semiconductor die 230 includes a conductive bump 220 formed thereon. Each conductive bump 220 is brought into direct contact with the first plated layer 214 of a respective one of the I/O pads 210 of the corresponding semiconductor package 200.

Figure 7H:
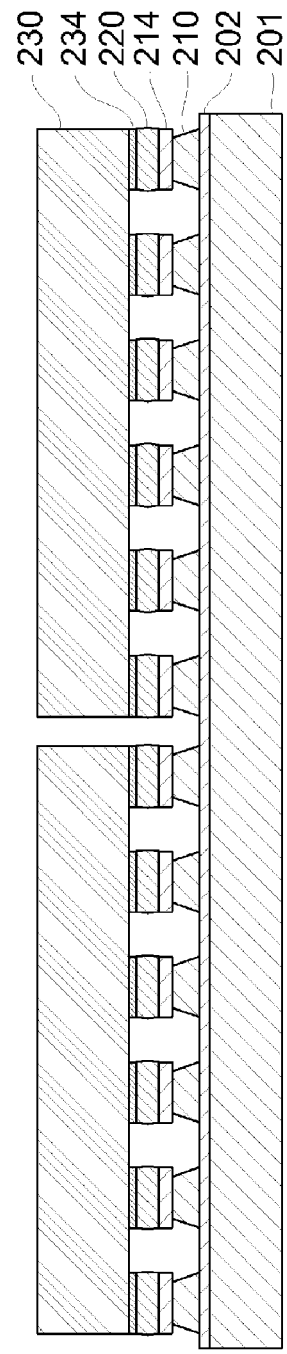

In the next step of the fabrication process shown in FIG. 7H, a reflow process is completed wherein each conductive bump 220 is melted so as to effectively join and thus electrically connect each first plated layer 214 to a respective one of the bonding pads 234 of the corresponding semiconductor die 230. The reflow process is typically conducted at temperatures in the range of from about 150° C. to about 250° C. As such, the conductive bumps 220 function to electrically connect each semiconductor die 230 to the I/O pads 210 of the corresponding semiconductor package 200 in an arrangement commonly referred to as flip chip type connection.

In the next step of the fabrication process shown in FIG. 7I, the package bodies 240 of the semiconductor packages 200 are formed by applying a layer of encapsulant material over the semiconductor dies 230, the first plated layers 214, the reflowed conductive bumps 220, and the I/O pads 210. As seen in FIG. 7I, such encapsulant material also flows into direct contact with those portions of the barrier layer 202 exposed as a result of the etching of the pad layer 203 to form the I/O pads 210.

In the next step of the fabrication process shown in FIG. 7J, the carrier 201 is removed. The removal of the carrier 201 is preferably facilitated by an etching process through the use of a suitable etching liquid. Since the etching liquid preferably used to etch the carrier 201 does not react with the barrier layer 202, the barrier layer 202 is exposed upon the removal of the carrier 201.

In the step of the fabrication process shown in FIG. 7K, the barrier layer 202 is etched and completely removed through the use of a suitable etching liquid. However, as will be described in more detail below, the barrier layer 202 may only be partially removed. In the event the barrier layer 202 is to be completely removed, the etching liquid used to etch the barrier layer 202 is one which does not react with the previously formed I/O pads 210. The etching liquid is also one which does not react with the encapsulant material used to form the integrally connected package bodies 240. Upon the etching and removal of the barrier layer 202, the second surfaces 212 of the I/O pads 210 are exposed in the bottom surfaces of respective ones of the integrally connected package bodies 240 formed from the hardened encapsulant material in the manner shown in FIG. 7K.

In the next step of the fabrication process shown in FIG. 7L, the second plated layers 215 are formed on the second surfaces 212 of respective ones of the I/O pads 210. The second plated layers 215 are formed by applying any of the suitable materials described above in relation to FIGS. 3A-3C onto the second surfaces 212 of respective ones of the I/O pads 210. As indicated above, the fully formed second plated layers 215 typically protrude downwardly from the bottom surfaces 242 of the integrally connected package bodies 240 formed by the hardened encapsulant material. As also indicated above, the step of forming the second plated layers 215 as shown in FIG. 7L may be substituted with the formation of the above-described OSP's on the second surface 212 of each I/O pad 210.

In the final step of the fabrication process shown in FIG. 7M, a singulation process is conducted to separate the fully formed semiconductor packages 200 from each other. In the singulation process, the hardened encapsulant material is sawed in a manner forming the separate package bodies 240 of the semiconductor packages 200. The sawing process may be completed through the use of, for example, a sawing tool 206. Any surface of each package body 240 may be marking-processed by laser or ink before the performance of the singulation process.

Referring now to FIG. 8A, as indicated above in relation to FIG. 7K, the barrier layer 202 may be partially removed through the completion of a suitable etching process as opposed to being completely removed. In order to facilitate such partial etching of the barrier layer 202, a dry film 204 may be applied to the exposed surface of the barrier layer 202, with the dry film 204 thereafter being patterned in the manner shown in FIG. 8A. Upon the patterning thereof, the dry film 204 partially remains on the bottom surface of the barrier layer 202, and covers areas corresponding to the second surface 212 of each of the I/O pads 210. As shown in FIG. 8B, subsequent to the patterning of the dry film 204, an etching process is completed, with the remaining dry film 204 functioning as a mask in a manner allowing for the etching of the barrier layer 202 in a manner forming the second plated layers 215. Thus, the fabrication steps shown in FIGS. 8A and 8B may be implemented as an alternative to the fabrication steps shown and described above in relation to FIGS. 7K and 7L.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
a die pad having opposed first and second pad surfaces, and a third pad surface extending between the first and second pad surfaces;
a conductive ring having opposed first and second ring surfaces, and a third ring surface extending between the first and second ring surfaces;
a plurality of I/O pads which each have opposed first and second surfaces, and a third surface which extends between the first and second surfaces, the I/O pads being segregated into at least an inner set which extends at least partially about the conductive ring and an outer set which extends at least partially about the inner set, the third surface of each of the I/O pads being inclined such that the first surface is of a first area and the second surface is of a second area which exceeds the first area, the first surface of each of the I/O pads further defining a peripheral edge and including a first plated layer which is formed thereon and protrudes beyond the peripheral edge;
at least one semiconductor die attached to the first pad surface of the die pad and electrically connected to the die pad, the conductive ring and at least one of the I/O pads; and
a package body at least partially encapsulating the die pad, the conductive ring, the I/O pads and the semiconductor die such that at least the second pad surface of the die pad, the second ring surface of the conductive ring and the second surfaces of each of the I/O pads are each exposed in a common exterior surface of the package body.

2. The semiconductor package of claim 1 wherein:
the first pad surface of the die pad defines a peripheral edge and includes a first plated pad layer formed thereon; and the first plated pad layer protrudes beyond the peripheral edge of the first pad surface.

3. The semiconductor package of claim 2 wherein the third pad surface of the die pad is inclined such that the first pad surface is of a first area and the second pad surface is of a second area which exceeds the first area.

4. The semiconductor package of claim 1 wherein the second pad surface of the die pad includes a second plated pad layer which is formed thereon and protrudes outwardly beyond the exterior surface of the package body.

5. The semiconductor package of claim 1 wherein:
the first ring surface of the conductive ring defines inner and outer peripheral edges and includes a first plated ring layer formed thereon; and
the first plated ring layer protrudes beyond the inner and outer peripheral edges of the first ring surface.

6. The semiconductor package of claim 5 wherein the third ring surface of the conductive ring is inclined such that the first ring surface is of a first area and the second ring surface is of a second area which exceeds the first area.

7. The semiconductor package of claim 1 wherein the second ring surface of the conductive ring includes a second plated ring layer which is formed thereon and protrudes outwardly beyond the exterior surface of the package body.

8. The semiconductor package of claim 1 wherein the second surface of each of the I/O pads includes a second plated layer which is formed thereon and protrudes outwardly beyond the exterior surface of the package body.

9. The semiconductor package of claim 1 wherein the semiconductor die is electrically connected to the die pad, the conductive ring anti each of the I/O pads by conductive wires which are covered by the package body.

10. A semiconductor package, comprising:
a plurality or I/O pads which each have opposed first and second surfaces, and a third surface which extends between the first and second surfaces, the first surface of each of the I/O pads defining a peripheral edge and including a first plated layer formed thereon which protrudes beyond the peripheral edge of the first surface, the third surface of each of the I/O pads being inclined such that the first surface is of a first area and the second surface is of a second area which exceeds the first area;
at least one semiconductor die electrically connected to each of the I/O pads; and
a package body at least partially encapsulating the I/O pads and the semiconductor die such that at least the second surfaces of each of the I/O pads are each exposed in a common exterior surface of the package body.

11. The semiconductor package of claim 10 wherein the at least one semiconductor die is electrically connected to the I/O pads by conductive wires which are covered by the package body.

12. A semiconductor package, comprising:
a die pad having opposed first and second pad surfaces, and a third pad surface extending between the first and second pad surfaces, the first pad surface of the die pad defining a peripheral edge and including a first plated pad layer formed thereon which protrudes beyond the peripheral edge of the first pad surface;
a conductive ring having opposed first and second ring surfaces, and a third ring surface extending between the first and second ring surfaces, the first ring surface of the conductive ring defining inner and outer peripheral edges and including a first plated ring layer formed thereon which protrudes beyond the inner and outer peripheral edges of the first ring surface;

a plurality of I/O pads which each have opposed first and second surfaces, and a third surface which extends between the first and second surfaces, the third surface of each of the I/O pads being inclined such that the first surface is of a first area and the second surface is of a second area which exceeds the first area, the I/O pads being segregated into at least an inner set which extends at least partially about the conductive ring and an outer set which extends at least partially about the inner set, the first surface of each of the I/O pads defining a peripheral edge and including a first plated layer formed thereon which protrudes beyond the peripheral edge of the first surface;

at least one semiconductor die attached and electrically connected to the first plated pad layer of the die pad, the semiconductor die further being electrically connected to the first plated ring layer of the conductive ring and the first plated layer of at least one of the I/O pads; and a package body at least partially encapsulating the die pad, the conductive ring, the I/O pads, the first plated pad layer, the first plated ring layer, the first plated layer, and the semiconductor die such that at least the second pad surface of the die pad, the second ring surface of the conductive ring and the second surfaces of each of the I/O pads are each exposed in a common exterior surface of the package body.

13. The semiconductor package of claim 12 wherein:
the third pad surface of the die pad is inclined such that the first pad surface is of a first area and the second pad surface is or a second area which exceeds the first area; and
the third ring surface of the conductive ring is inclined such that the first ring surface is of a first area and the second ring surface is of a second area which exceeds the first area.

14. The semiconductor package of claim 13 wherein:
the second pad surface of the die pad includes a second plated pad layer which is formed thereon and protrudes outwardly beyond the exterior surface of the package body;
the second ring surface of the conductive ring includes a second plated ring layer which is formed thereon and protrudes outwardly beyond the exterior surface of the package body; and
the second surface of each of the I/O pads includes a second plated layer which is farmed thereon and protrudes outwardly beyond the exterior surface of the package body.

15. The semiconductor package of claim 12 wherein the semiconductor die is electrically connected to the first plated pad layer of the die pad, the first plated ring layer of the conductive ring and the first plated layer of each of the I/O pads by conductive wires which are covered by the package body.

16. A semiconductor package, comprising:
a plurality of I/O pads which each have opposed first and second surfaces, and a third surface which extends between the first and second surfaces, the first surface of each of the I/O pads defining a peripheral edge and including a first plated layer formed thereon which protrudes beyond the peripheral edge of the first surface, the third surface of each of the I/O pads being formed such that the first and second surfaces are of differing areas;

at least one semiconductor die attached and electrically connected to each of the I/O pads; and a package body at least partially encapsulating the I/O pads and the semiconductor die such that at least the second surfaces of each of the I/O pads are each exposed in a common exterior surface of the package body.

17. The semiconductor package of claim 16 wherein the at least one semiconductor die is electrically connected to the I/O pads by conductive wires which are covered by the package body.

18. The semiconductor package of claim 16 wherein the second surface of each of the I/O pads includes a second plated layer which is formed thereon and protrudes outwardly beyond the exterior surface of the package body.

19. The semiconductor package of claim 16 wherein the semiconductor die is electrically connected to the first plated layer of each of the I/O pads by conductive humps which are covered by the package body.

20. The semiconductor package of claim 16 wherein:
the semiconductor die defines a side surface; and
each of the I/O pads is disposed underneath the semiconductor die inboard of the side surface thereof.

21. A semiconductor package, comprising:
a die pad having opposed first and second pad surfaces, the first pad surface of the die pad defining a peripheral edge and including a first plated pad layer farmed thereon which protrudes beyond the peripheral edge of the first pad surface;

a conductive ring having opposed first and second ring surfaces, the first ring surface of the conductive ring defining inner and outer peripheral edges and including a first plated ring layer formed thereon which protrudes beyond the inner and outer peripheral edges of the first ring surface;

a plurality of I/O pads which each have opposed first and second surfaces, and a third surface which extends between the first and second surfaces, the third surface of each of the I/O pads being inclined such that the first surface is of a first area and the second surface is of a second area which exceeds the first area, the first surface of each of the I/O pads defining a peripheral edge and including a first plated layer formed thereon which protrudes beyond the peripheral edge of the first surface;

at least one semiconductor die attached and electrically connected to the first plated pad layer of the die pad, the semiconductor die further being electrically connected to the first plated ring layer of the conductive ring and the first plated layer of at least one of the I/O pads; and a package body at least partially encapsulating the die pad, the conductive ring, the I/O pads, the first plated pad layer, the first plated ring layer, the first plated layer, and the semiconductor die such that at least the second pad surface of the die pad, the second ring surface of the conductive ring and the second surfaces of each of the I/O pads are each exposed in a common exterior surface of the package body.

* * * * *